US005594675A

United States Patent [19]
Peng

[11] Patent Number: 5,594,675
[45] Date of Patent: Jan. 14, 1997

[54] REDUCED SIGNAL PROCESSING REQUIREMENT SAMPLE AND HOLD LINEAR PHASE INTERPOLATIVE FIR FILTER

[75] Inventor: Yung-Chow Peng, Chutung, Taiwan

[73] Assignee: Industrial Technology Research Institute, Chutung, Taiwan

[21] Appl. No.: 275,158

[22] Filed: Jul. 14, 1994

[51] Int. Cl.[6] ............................. G06F 17/17; G06F 7/38
[52] U.S. Cl. ...................................... 364/724.1; 364/723
[58] Field of Search ................................ 364/724.1, 723, 364/718; 341/61; 375/441, 344

[56] References Cited

U.S. PATENT DOCUMENTS 4,691,292  9/1987  Rothweiler ............................ 364/724.1
4,829,378  5/1989  LeGall .................................... 358/160

(List continued on next page.)

OTHER PUBLICATIONS

I.E.E.E. Press, "Oversampling Delta–Sigma Data Converters: Theory, Design and Simulation" Proc. of the I.E.E.E., vol. 69, No. 3, Mar., 1988 pp. 417–448.

(List continued on next page.)

*Primary Examiner*—Roy N. Envall, Jr.
*Assistant Examiner*—Emmanuel L. Moise
*Attorney, Agent, or Firm*—Meltzer, Lippe, Goldstein, et al.

[57] ABSTRACT

A digital FIR filter for producing an L phase interpolation of a input sample $$X\left(\left\lfloor \frac{t-1}{L} \right\rfloor - i\right)$$

based on L filter banks and n tap coefficients $P_1(i)$ in each $1^{th}$ one of the filter banks is disclosed, where $1 \leq 1 \leq L$ and where $0 \leq i \leq (n-1)$. The digital filter includes a first circuit for producing, for each time t, bank filter terms of a merged bank filter having an output value which changes between a previous time $t-1$ and the time $t$. The produced bank filter terms include at least one combination of two cross-symmetric bank filter terms:

for the in phase condition:

$$P_k(i) \cdot X\left(\left\lfloor \frac{t-k}{L} \right\rfloor - i\right) + P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right) + P_{L-k+1}(n-1-i) \cdot X\left(\left\lfloor \frac{t-(L-k+1)}{L} \right\rfloor - (n-1-i)\right)$$

and for the out of phase condition: the same as the in phase condition except that the parameter i in the product terms, $$P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right)$$

are replaced by $i-1$,
of the L filter banks on which the digital filter is based, where $1 \leq k \leq L$ and for any non-negative integer $w = 0, 1, 2, \ldots$, $t = w \cdot L + k$. The digital filter also includes a second circuit for adding together, for each time t, the bank filter terms produced in the first circuit to produce the merged bank filter output value which changes between the previous time $t-1$ and the time t. A third circuit may be provided for adding together $\lceil L/2 \rceil$ merged bank filter output values to produce an interpolated value $g(t)$ of the inputted sample $$X\left(\left\lfloor \frac{t-1}{L} \right\rfloor - i\right).$$

23 Claims, 17 Drawing Sheets

U.S. PATENT DOCUMENTS

| | | | |
|---|---|---|---|
| 4,862,402 | 8/1989 | Shah et al. | 364/724.12 |
| 5,067,141 | 11/1991 | Critchlow et al. | 364/724.1 |
| 5,274,372 | 12/1993 | Luthra et al. | 341/61 |
| 5,379,241 | 1/1995 | Greggain | 364/723 |
| 5,420,891 | 5/1995 | Akansu | 375/350 |

OTHER PUBLICATIONS

D. Elliot, Handbook of Digital Signal Processing Engineering Applications, p. 239 (1987).Sams, Advanced Digital Audio, pp. 392–393, 419 (1991).

$I^2S$ Sound, Stereo CMOS for Compact Disc Digital Audio Systems, pp. 747–775 (Jan. 1988).

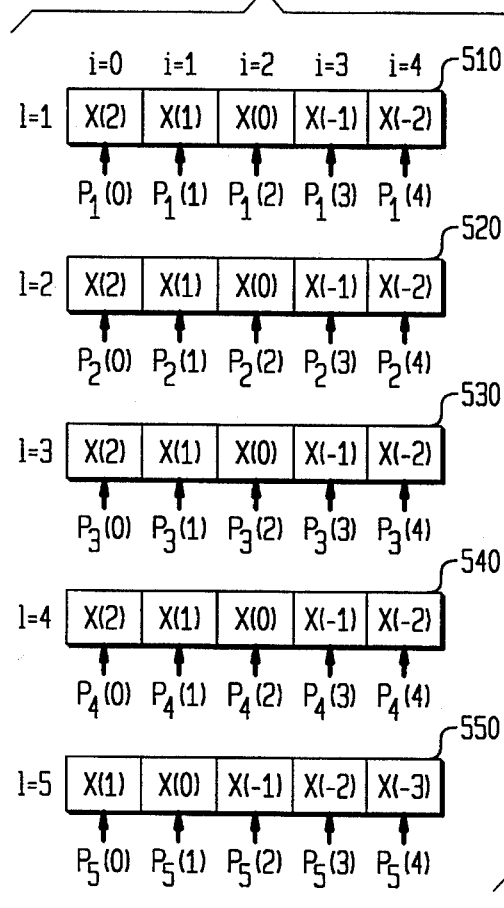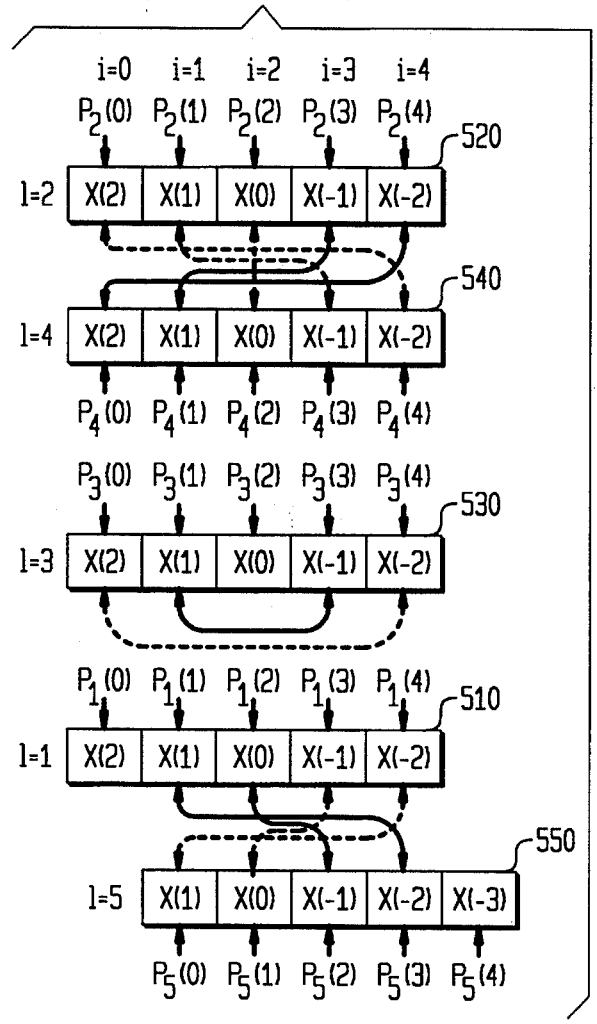
FIG. 6A
FIG. 6B
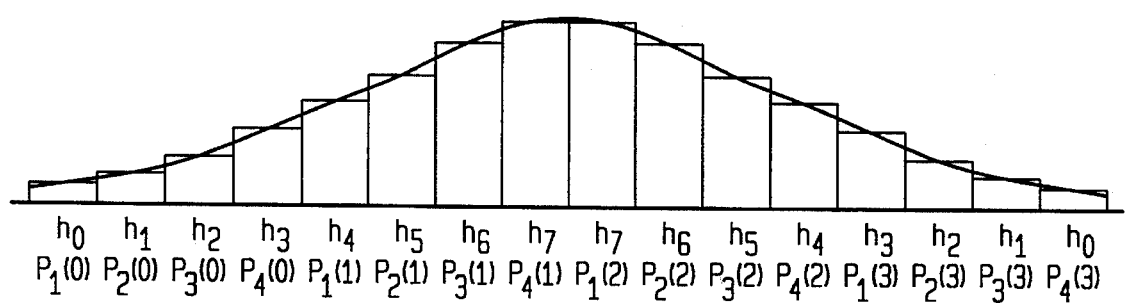
FIG. 8

FIG. 9A1

FIG. 9A2
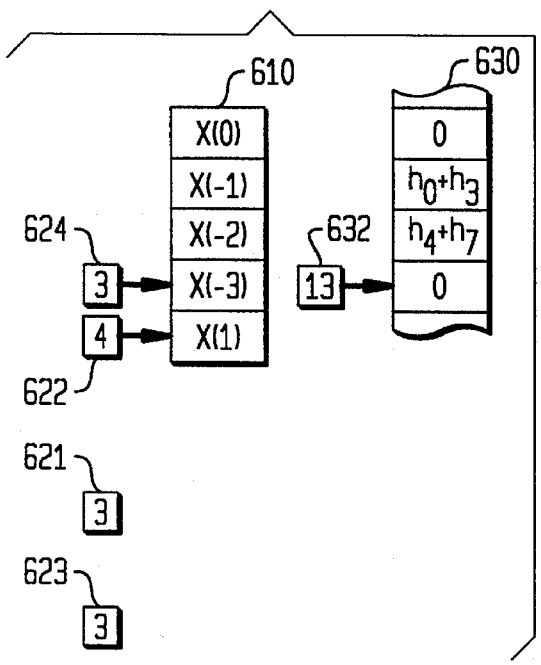
FIG. 9A3
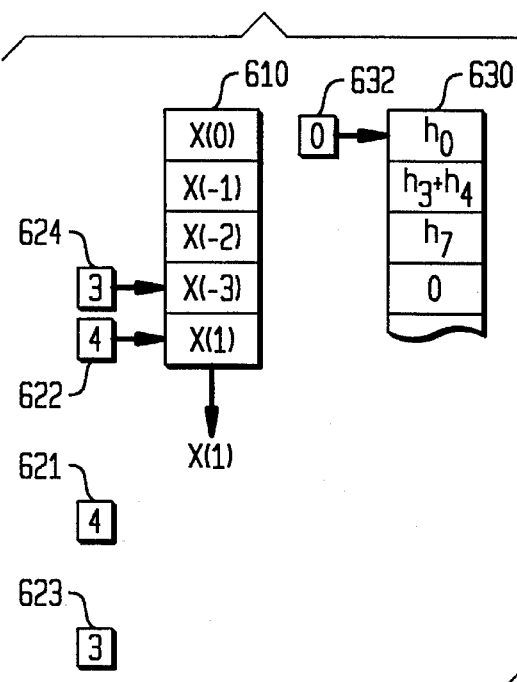
FIG. 9A4
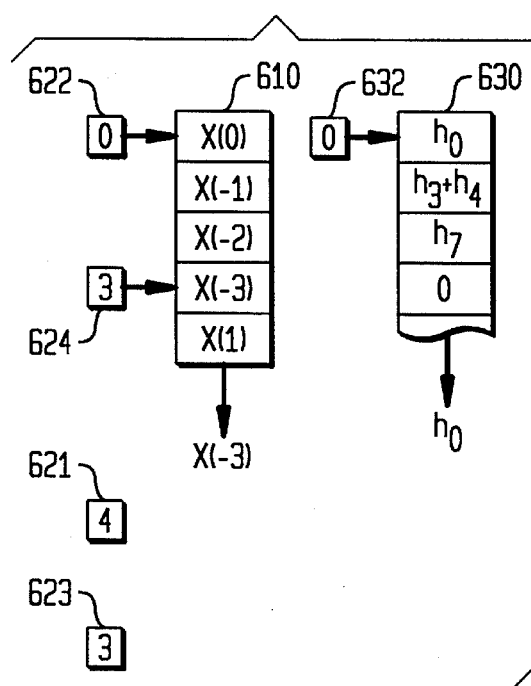

REDUCED SIGNAL PROCESSING REQUIREMENT SAMPLE AND HOLD LINEAR PHASE INTERPOLATIVE FIR FILTER

FIELD OF THE INVENTION

The present invention relates to processing digital signals using a finite impulse response (FIR) filter.

BACKGROUND OF THE INVENTION

Finite impulse response (FIR) filters are digital filters comprising a number of tap coefficients or weights. Samples of an input signal X(t) are shifted into the FIR filter one sample per cycle. At each cycle t, the FIR filter computes the sum y(t):

$$y(t) = \sum_{i=0}^{n-1} P(i) \cdot X(t-i) \quad (1)$$

where, $X(t-i)$ is a $t-i^{th}$ sample of X, P(i) is an $i^{th}$ tap coefficient of the FIR filter for $0 \leq i \leq (n-1)$ and n is the number of tap coefficients of the FIR filter.

FIR filters are very useful in a number of applications, such as interpolation. FIG. 1 shows a polyphase interpolator 100 disclosed in J. Candy & G. Temes, "*Oversampling Delta-Sigma Data Converters: Theory, Design and Simulation*" PROC. OF THE I.E.E.E., vol. 69, no. 3, March, 1988 pp. 417–448. The interpolator 100 actually comprises L FIR filter banks 110-1, 110-2, . . . , 110-L which receive an inputted signal $X(\lfloor t/L \rfloor)$ that has been oversampled by a factor of L. (Herein, "$\lfloor C \rfloor$" means the nearest integer $\leq C$.)

The shifting in of samples $X(\lfloor t/L \rfloor)$ for L times oversampled sample/hold data is illustrated in FIGS. 2(a)–(e). Assume that L=5 and n=3. Define a value v=t mod L. At a time t=0, v=0 and the samples are as shown in FIG. 2(a). As shown, the values in each filter bank 110-1 to 110-5 are the same. The filter banks 110-1 to 110-5 are thus said to be in phase. At time t=1, (v=1) a sample X(2) is shifted into the filter bank 110-1 as shown in FIG. 2(b). Thus, the filter bank 110-1 is out of phase with the filter banks 110-2 to 110-5. Likewise, FIGS. 2(c) shows the shifting of X(2) into the filter bank 110-2 at time t=2 for v=2. FIG. 2 (d) shows the shifting of X(2) into the filter bank 110-3 at time t=3 for v=3. FIG. 2(e) shows the shifting of X(2) into the filter bank 110-4 at time t=4 for v=4. Finally, FIG. 2(f) shows the shifting of X(2) into the filter bank 110-5 at time t=5 for v=0. In FIG. 2(f), the filter banks 110-1 to 110-5 are once again in phase.

The output of each FIR filter bank 110-1, 110-2, . . . , 110-L is fed to a corresponding upsampling circuit 120-1, 120-2, . . . , 120-L which upsamples the outputted signal L times. See D. ELLIOT, HANDBOOK OF DIGITAL SIGNAL PROCESSING ENGINEERING APPLICATIONS, p. 239 (1987). The upsampled, filtered signals $y_1(t), y_2(t), \ldots , y_L(t)$ are then added together wherein each outputted upsampled, filtered signal, e.g., $y_L(t)$, is delayed by one cycle $z^{-1}$ with respect to a preceding upsampled filtered signal, e.g., $y_{L-1}(t)$, to produce an interpolation g(t) of the inputted samples at the time t, where:

$$g(t) = \sum_{l=1}^{L} y_l(t) = \sum_{l=1}^{L} \sum_{i=1}^{n-1} P_l(i) \cdot X\left(\lfloor \frac{t-l}{L} \rfloor - i\right) \quad (2)$$

The problem with the interpolator 100 is that it requires many FIR filters which can occupy precious area on an IC chip. FIG. 3 shows another conventional polyphase interpolator 200 for use in audio applications. In the interpolator 200, it is assumed that:

$$X\left(\lfloor \frac{t-l}{L} \rfloor - i\right) = 0 \quad (3)$$

for $s \neq 1$, where s=t modulus L if (t modulus L)$\neq 0$ and s=L if t modulus L=0. Such an assumption is possible if the input signal X contains sample data. Thus, equation (2) can be simplified to:

$$g(t) = y_s(t) = \sum_{i=0}^{n-1} P_s(i) \cdot X\left(\lfloor \frac{t-s}{L} \rfloor - i\right) \quad (4)$$

In FIG. 3, the interpolator 200 is provided with a RAM 210 for storing n input samples, e.g., X(0), X(1), . . . , X(n−1). Each sample is presumed to be a b bit number. Thus, the RAM 210 is an n×b bit RAM. An (L×n)×d bit ROM 220 is also provided for storing each possible d bit tap coefficient $P_s(i)$ (where $1 \leq s \leq L$ and $0 \leq i \leq (n-1)$). To compute g(t) at a particular time t, a controller (not shown) successively outputs n appropriate samples $$X\left(\lfloor \frac{t-s}{L} \rfloor - i\right)$$

and n corresponding tap coefficients $P_s(i)$ to the multiplier 230. The multiplier 230 multiplies each of the n samples with its corresponding tap coefficient and outputs each product thus formed to an accumulator 240. The accumulator 240 accumulates n such products to produce each g(t). The interpolator 200 thus utilizes n multiplications and n accumulations to produce each g(t).

If the input signal X contains sample/hold data, then equation (2) can be simplified as follows:

$$g(t) = X\left(\lfloor \frac{t}{L} \rfloor\right) \cdot \sum_{l=1}^{k} P_l(0) + \quad (5)$$
$$\sum_{i=0}^{n-2} X\left(\lfloor \frac{t}{L} \rfloor - 1 - i\right) \cdot$$
$$\left(\sum_{l=k+1}^{L} P_l(i) + \sum_{l=1}^{k} P_l(i+1)\right) +$$
$$X\left(\lfloor \frac{t}{L} \rfloor - n\right) \cdot \sum_{l=k+1}^{L} P_l(n-1)$$

where $$1 \leq k \leq L, \text{ and } \sum_{l=k+1}^{L} P_l(i) = 0, \text{ if } k = L.$$

The conventional interpolator 200 can be modified to perform such a sample/hold interpolation. In particular, an (n+1)×b bit RAM 210 is provided for storing n+1 input samples $X(\lfloor t/L \rfloor), X(\lfloor t/L \rfloor-1), \ldots , X(\lfloor t/L \rfloor-n)$. Likewise, an (L×(n+1))×d bit ROM 220 is provided for storing L×(n+1) different sums of tap coefficients, i.e., L, (n−1)×L, and L sums of $$\sum_{l=1}^{k} P_l(0) \quad (5a)$$

$$\sum_{l=k+1}^{L} P_l(i) + \sum_{l=1}^{k} P_l(i+1) \quad (5b)$$

$$\sum_{l=k+1}^{L} P_l(n-1) \quad (5c)$$

respectively, for the three addends of equation (5). To compute each g(t) for each time t, a controller (not shown) sequentially outputs n+1 samples from the RAM 210 and n+1 corresponding sums of tap coefficients from the ROM 220 to the multiplier 230. The multiplier 230 outputs n+1 products which are accumulated in the accumulator 240 to produce g(t) according to equation (5). In this case, the interpolator 200 must perform n+1 multiplications and n+1 accumulations.

FIG. 4 shows another conventional interpolator 300 for interpolating audio sample data. As before, the interpolator 300 has an n×b bit RAM 310 and an (L×n)×b bit ROM 320. Unlike before, each tap coefficient $P_1(i)$ stored in the ROM 320 is chosen to be a power of two with only two or three non-zero bits. In operation, each of the n samples is sequentially outputted from the RAM 310 to a shift register 330. The corresponding n tap coefficients are sequentially outputted to a control circuit 340. The control circuit multiplies each tap coefficient with its corresponding sample according to Booth's algorithm. That is, for each non-zero bit q where $0 \leq q \leq d-1$, the sample is shifted q bits to the left and outputted to an accumulator 350 which accumulates each outputted, shifted result. The accumulator 350 accumulates the n products to produce g(t) for a particular t.

FIG. 5 shows yet another conventional interpolator 400 which is disclosed in U.S. Pat. No. 4,862,402. The interpolator 400 interpolates video sample data The sample data $$X\left(\left\lfloor \frac{t-s}{L} \right\rfloor - i\right)$$

can be written in binary notation as:

$$X\left(\left\lfloor \frac{t-s}{L} \right\rfloor - i\right) = \sum_{m=0}^{b-1} x_m \left(\left\lfloor \frac{t-s}{L} \right\rfloor - i\right) \cdot 2^m \quad (6)$$

where $x_m$ is a vector of bits '' or '1' representing an inputted sample. By combining equations (4) and (6), g(t) may be written as:

$$g(t) = \sum_{m=0}^{b-1} \left( \sum_{i=0}^{n-1} P_s(i) \cdot x_m \left(\left\lfloor \frac{t-s}{L} \right\rfloor - i\right) \right) \cdot 2^m \quad (7)$$

Equation (7) is useful for implementing a Booth's algorithm technique for producing the product of each sample and its corresponding tap coefficient (by selectively shifting each sample and accumulating the shifted sample depending on each $q^{th}$ bit of the tap coefficient). However, the interpolator 400 employs a modified Booth's algorithm technique. In the modified Booth technique, pairs of adjacent $q_1^{th}$, $q_2^{th}$ bits $0 \leq q_1 \leq d$, $q_2 = q_1 + 1$ of the tap coefficient are simultaneously used to selectively accumulate the sample shifted $q_1$ and $q_2 = q_1 + 1$ bits to the left. Two bit planes of the input signal X can be merged by separating the summation from m=0 to b−1 into parallel even and odd summations. Equation (7) may then be rewritten as:

$$g(t) = \sum_{r=0}^{\frac{b}{2}-1} \left[ \sum_{m=2 \cdot r}^{2 \cdot r+1} \left( \sum_{i=0}^{n-1} P_s(i) \cdot x_m \left(\left\lfloor \frac{t-s}{L} \right\rfloor - i\right) \right) \cdot 2^m \right] \quad (8)$$

In the interpolator 400, a module 410 is provided for preprocessing the tap coefficients $P_s(i)$ and for outputting the processed results to modules 420-0, 420-1, . . . , 420-R where R=b/2−1. Each tap coefficient $P_s(i)$ is sequentially loaded into the module 410 via the line 411. The n tap coefficients $P_s(i)$ are shifted into a first shift register column 412. Furthermore, a multiplier 414 and adder 416 compute $3 \cdot P_s(i)$ for each coefficient and sequentially shift the n values $3 \cdot P_s(i)$ into the shift register column 418. Once fully loaded, the module 410 outputs, in parallel, pairs of coefficients $P_s(i)$, $3 \cdot P_s(i)$ for each i from 0 to n−1 and a particular value of s. Furthermore, each shift register column 412 and 418 is provided with L·n registers (e.g., 412-0-1, . . . , 412-0-L) for storing coefficients $P_s(i)$, $3 \cdot P_s(i)$, respectively, for each s and a multiplexer (e.g., 413-1, and 415-1) for outputting appropriate coefficient pairs depending on the inputted sample $$X\left(\left\lfloor \frac{t-s}{L} \right\rfloor - i\right).$$

Each of the modules 420-0, 420-1, . . . , 420-R receives a corresponding adjacent pair of bits $X_{2r}$, $X_{2r+1}$ of an inputted sample $$X\left(\left\lfloor \frac{t-s}{L} \right\rfloor - i\right)$$

(the module 420-0 receives the bits $X_0$, $X_1$, the module 420-1 receives the bits $X_2$, $X_3$, etc.). Within each module, e.g., the module 420-0, the inputted pair of bits $X_0$, $X_1$ are decoded in a decoder 421. The decoded bits are then inputted as selector control signals to n multiplexers 422-0, 422-1, . . . , 422-(n−1). Each $i^{th}$ multiplexer (where $0 \leq i \leq (n-1)$) 422-i receives a corresponding pair of coefficients $P_s(i)$, $3 \cdot P_s(i)$ and selects one of the values 0, $P_s(i)$, $2 \cdot P_s(i)$, $3 \cdot P_s(i)$ (depending on the decoded sample bits) to produce the partial product:

$$\sum_{m=2 \cdot r}^{2 \cdot r+1} P_s(i) \cdot X_m \left(\left\lfloor \frac{t-s}{L} \right\rfloor - i\right) \cdot 2^m$$

The n partial products are outputted from the multiplexers 422-0 to 422-(n−1) to a summation stage 424 which adds up the partial products to produce the sum:

$$f_r = \sum_{i=0}^{n-1} \left( \sum_{m=2 \cdot r}^{2 \cdot r+1} P_s(i) \cdot X_m \left(\left\lfloor \frac{t-s}{L} \right\rfloor - i\right) \cdot 2^m \right)$$

Each of the sums $f_0(t), f_1(t), \ldots, f_R(t)$ outputted from the multiplier modules 420-0, 420-1, . . . , 420-R are added together by a plurality of adders interconnected in a binary adder tree 430 to produce g(t).

Each of the prior art interpolators has disadvantages. The interpolator 200 is disadvantageous because many time consuming multiplications (and many additions, which are time consuming to a lesser degree) are required to produce each g(t). The interpolator 300 is disadvantageous because each tap coefficient must be a power of two. This can compromise the performance of the interpolator 300. In particular, it is very difficult to meet certain desired frequency responses in certain applications using the interpolator 300. The interpolator 400 is fast but occupies a very large surface area on an IC chip.

It is therefore the object of the present invention to provide a polyphase FIR filter which overcomes the disadvantages of the prior art.

SUMMARY OF THE INVENTION

These and other objects are achieved by the present invention. According to one embodiment, cross-symmetric bank filter terms are combined to form merged filter banks. Suppose there are L filter banks numbered $1, \ldots, 1, \ldots, L$ and n tap coefficients numbered $0, \ldots, i, \ldots n-1$ per filter bank. Then the $i^{th}$ filter term of the $1^{th}$ bank filter is cross-symmetric with the $(n-i-1)^{th}$ bank filter term in the $(L-1+1)^{th}$ filter bank.

At least one combination of two cross-symmetric filter bank terms is formed where the filter bank terms are: for phase condition:

$$P_k(i) \cdot X\left(\left\lfloor \frac{t-k}{L} \right\rfloor - i\right) +$$

$$P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right) +$$

$$P_{L-k+1}(n-1-i) \cdot X\left(\left\lfloor \frac{t-(L-k+1)}{L} \right\rfloor - (n-1-i)\right)$$

and for the out of phase condition: the same as the in phase condition, except that the parameter i in the product terms, $$P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right)$$

is replaced by i−1.

Each time t a sample $$X\left(\left\lfloor \frac{t-k}{L} \right\rfloor - i\right)$$

is shifted into one of the filters banks, thereby changing the bank filter terms therein. The sample in other filters banks are not changed. Define $t=wL+k$, where $1 \leq k \leq L$ and where w is any non-negative integer $0,1,2,\ldots$. When $L/2+1 \leq k \leq L$, a sample $$X\left(\left\lfloor \frac{t-k}{L} \right\rfloor - i\right)$$

is shifted into a $k^{th}$ filter bank so that it is in phase with the $(L-k+1)^{th}$ filter bank containing cross-symmetric bank filter terms. On the other hand, when $1 \leq k \leq L/2$, a sample $$X\left(\left\lfloor \frac{t-k}{L} \right\rfloor - i\right)$$

is shifted into a $k^{th}$ filter bank so that it is out of phase with the $(L-k+1)^{th}$ filter bank containing cross-symmetric bank filter terms.

By merging cross-symmetric bank filter terms, $J = \lceil L/2 \rceil$ new filter banks are formed with $U = \lceil n/2 \rceil$ bank filter terms where "$\lceil e \rceil$" means the ceiling of e or the largest integer less than e+1. Each of the changed "merged" filter banks between the interpolated outputs g(t) and g(t−1) at times t and t−1 is defined by the following characteristic equation (assuming n and L are even):

$$y'_j(t) = \sum_{i=0}^{n-1} P_k(i) \cdot X\left(\left\lfloor \frac{t-k}{L} \right\rfloor - i\right) + \qquad$$

$$\sum_{i=0}^{n-1} P_{L-k+1}(i) \cdot X\left(\left\lfloor \frac{t-(L-k+1)}{L} \right\rfloor - i\right)$$

where $1 \leq j \leq J$
and j=k if $1 \leq k \leq L/2$
j=L−k+1 if $L/2+1 \leq k \leq L$ In the case where $L/2+1 \leq k \leq L$, equation (9) reduces to:

$$y'_j(t) = \sum_{i=0}^{U-1} (P_k(i) + P_{L-k+1}(i)) \cdot \left[ X\left(\left\lfloor \frac{t-k}{L} \right\rfloor - i\right) + \right. \qquad (10)$$

$$\left. X\left(\left\lfloor \frac{t-k}{L} \right\rfloor - (n-i-1)\right) \right]$$

In the case where $1 \leq k \leq L/2$, the out of phase filter banks containing cross-symmetric bank filter terms can be shifted so that most of the cross-symmetric bank filter terms are in phase. Thus, equation (9) reduces to:

$$y'_j(t) = P_k(0) \cdot \left[ X\left(\left\lfloor \frac{t-k}{L} \right\rfloor\right) + \right. \qquad (11)$$

$$\left. X\left(\left\lfloor \frac{t+k-1}{L} \right\rfloor - n\right) \right] +$$

$$\sum_{i=1}^{U-2} (P_k(i) + P_{L-k+1}(i-1)) \cdot \left[ X\left(\left\lfloor \frac{t-k}{L} \right\rfloor - i\right) + \right.$$

$$\left. X\left(\left\lfloor \frac{t-k}{L} \right\rfloor - (n-i)\right) \right] +$$

$$2 \cdot P_k(U-1) \cdot X\left(\left\lfloor \frac{t-k}{L} \right\rfloor - U+1\right)$$

In short, an improved FIR filter interpolator is provided with merged filter banks formed by merging cross-symmetric bank filter terms. The merging of filter banks enables a dramatic reduction in processing time and circuit size requirements.

BRIEF DESCRIPTION OF THE DRAWING

FIGS. 6(a)–(b) illustrate the merging of cross-symmetric filter bank terms according to the present invention.

FIG. 8 shows an interpolator function from which tap coefficients are selected.

DETAILED DESCRIPTION OF THE INVENTION

Figure 1:
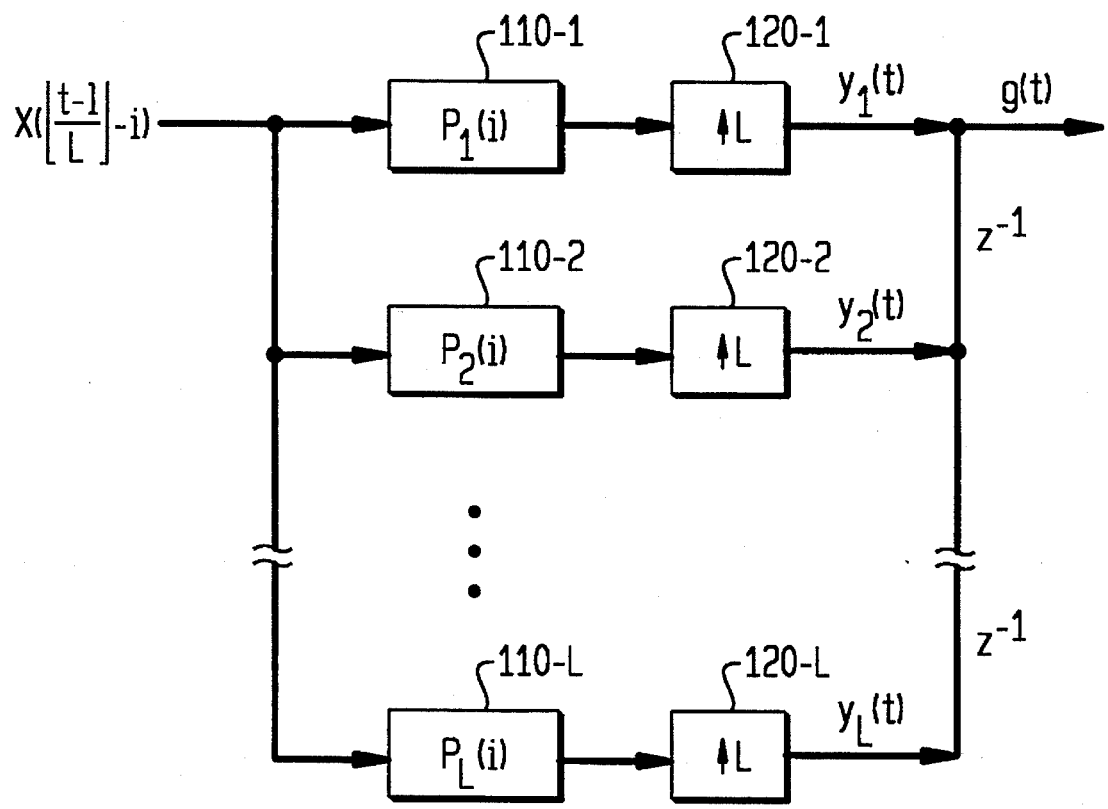
FIG. 1 shows a first conventional FIR filter interpolator.
Figure 2A:
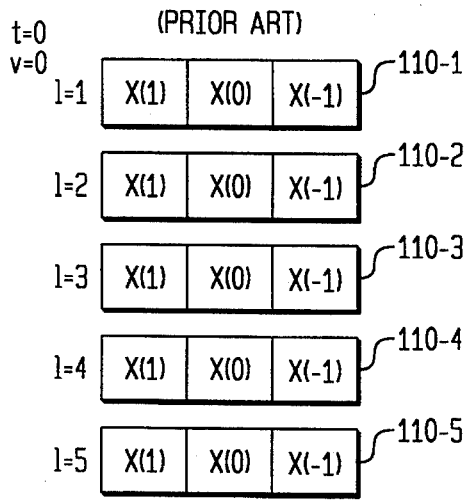
FIGS. 2(a)–(f) illustrates the shifting of sample and hold data into the FIR filter interpolator of FIG. 1.
Figure 2B:
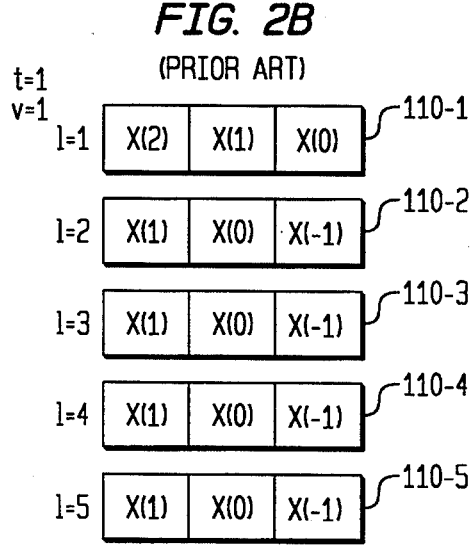
Figure 2C:
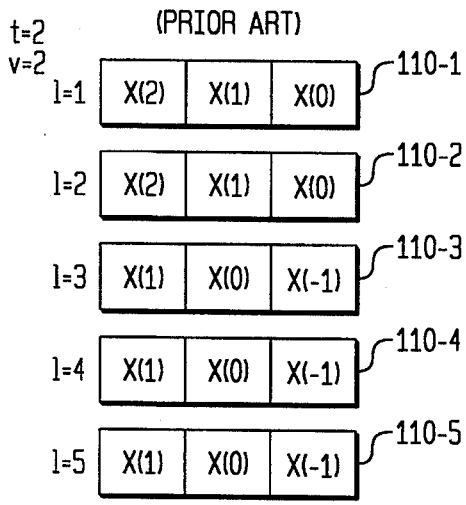
Figure 2D:
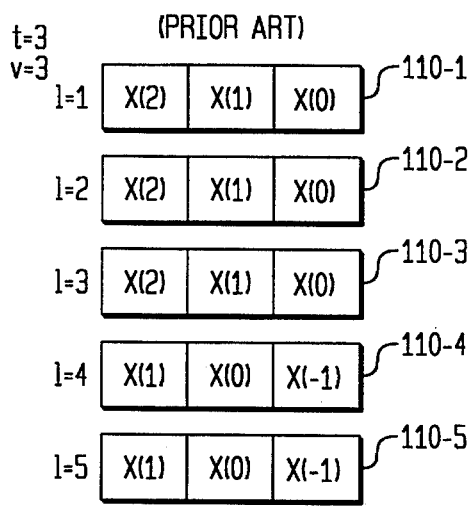
Figure 2E:
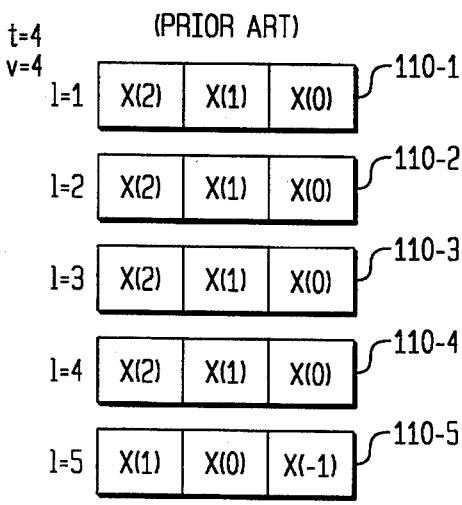
Figure 2F:
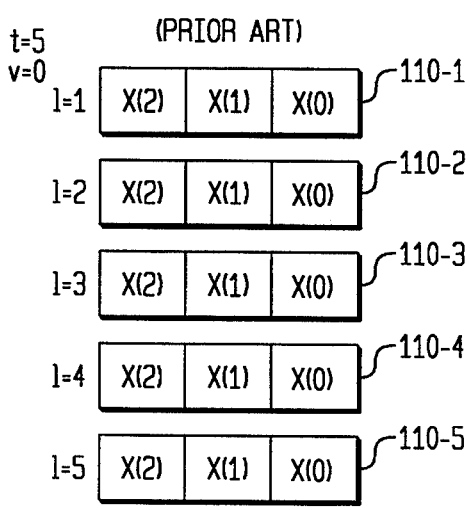

FIGS. 6(a)–6(b) illustrate the merging of cross-symmetric bank filter terms according to the present invention. FIG. 6(a) shows an example wherein L=5 filter banks 510, 520, 530, 540 and 550, respectively corresponding to phases, 1, 2, 3, 4, and 5, are provided with n=5 tap coefficients each. The filter banks 510, 520, 530, 540 and 550 have corresponding characteristic equations $y_1(t)$, $y_2(t)$, $y_3(t)$, $y_4(t)$ and $Y_5(t)$ which when added together produce the interpolated output g(t). At a time t, such that k=4 and t=wL+k=wL+4 (where w is any non-negative integer 0,1,2, . . . , and $1 \leq k \leq L$, e.g., t=4, 9, 14, etc.), an input sample X(2) is inputted to the tap array element 541 of the filter bank 540. (The sample X(1) formerly in the tap array element 541 at the time t−1 is shifted to the tap array element 542, the sample X(0) formerly in the tap array element 542 at the time t−1 is shifted to the tap array element 543, etc.). The bank filter 510 is out of phase with the bank filter 550. However, the bank filter 520 is in phase with the bank filter 540.

FIG. 6(b) shows the cross-symmetry between bank filter terms. Generally, form in-phase filter banks, the bank filter term of the $i^{th}$ tap coefficient of the $k^{th}$ filter bank is cross-symmetric with the bank filter term of the $(n-i-1)^{th}$ tap coefficient of the $(L-k+1)^{th}$ filter bank. The bank filter terms of the bank filters 520 and 540 are cross-symmetric as follows: The bank filter term $P_2(0) \cdot X(2)$ is cross-symmetric with the term $P_4(4) \cdot X(-2)$. The term $P_2(1) \cdot X(1)$ is cross-symmetric with the term $P_4(3) \cdot X(-1)$. The term $P_2(2) \cdot X(0)$ is cross-symmetric with the term $P_4(2) \cdot X(0)$. The term $P_2(3) \cdot X(-1)$ is cross-symmetric with the term $P_4(1) \cdot X(1)$. The term $P_2(4) \cdot X(-2)$ is cross-symmetric with the term $P_4(0) \cdot X(2)$.

The bank filter terms of the filter bank 530 are cross-symmetric with each other: The term $P_3(0) \cdot X(2)$ is cross-symmetric with the term $P_3(4) \cdot X(-2)$. The term $P_3(1) \cdot X(1)$ is cross-symmetric with the term $P_3(3) \cdot X(-1)$. The term $P_3(2) \cdot X(0)$ is cross-symmetric with itself.

The filter banks 510 and 550 are out of phase with each other. As shown in FIG. 6(b), the bank filter terms are re-aligned by shifting the filter banks 510 and 550 with respect to each other by one term. The term $P_1(1) \cdot X(1)$ is cross-symmetric with the term $P_5(3) \cdot X(-2)$. The term $P_1(2) \cdot X(0)$ is cross-symmetric with the term $P_5(2) \cdot X(-1)$. The term $P_1(3) \cdot X(-1)$ is cross-symmetric with the term $P_5(1) \cdot X(0)$. The term $P_1(4) \cdot X(-2)$ is cross-symmetric with the term $P_5(0) \cdot X(1)$. The term $P_1(0) \cdot X(2)$, is cross-symmetric with the term $P_5(4) \cdot X(-3)$.

The above-described merger produces $J = \lceil L/2 \rceil$ merged filter banks with $U = \lceil n/2 \rceil$ tap array elements each. The pairs of cross-symmetric bank filter terms are:
for the in phase conditions:

$$P_k(i) \cdot X\left(\left\lfloor \frac{t-k}{L} \right\rfloor - i\right),$$

$$P_{L-k+1}(i) \cdot X\left(\left\lfloor \frac{t-(L-k+1)}{L} \right\rfloor - i\right),$$

$$P_k(n-1-i) \cdot X\left(\left\lfloor \frac{t-k}{L} \right\rfloor - (n-1-i)\right)$$

and $$P_{L-k+1}(n-1-i) \cdot X\left(\left\lfloor \frac{t-(L-k+1)}{L} \right\rfloor - (n-1-i)\right)$$

and for the out of phase condition: the same terms as the in phase condition except that the parameter i in the product terms.

$$P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right)$$

will be replaced by i−1.

With the above pairs of cross-symmetric bank filter terms merged, the interpolation characteristic $y'_j(t)$ for each merged filter bank is provided by (assuming n and L are even):

$$y'_j(t) = \sum_{i=0}^{n-1} P_k(i) \cdot X\left(\left\lfloor \frac{t-k}{L} \right\rfloor - i\right) + \sum_{i=0}^{n-1} P_{L-k+1}(i) \cdot X\left(\left\lfloor \frac{t-(L-k+1)}{L} \right\rfloor - i\right) \quad (9)$$

where $1 \leq j \leq J$.

For each time t a sample $$X\left(\left\lfloor \frac{t-k}{L} \right\rfloor - i\right)$$

is shifted into a corresponding $k^{th}$ filter bank 510–550 of the interpolation filter 500. Ordinarily, this would change the value determined by one filter bank 510, 520, 530, 540 or 550. Likewise, for each t, only one merged filter bank with merged cross-symmetric bank filter terms changes its outputted value. Thus, to determine g(t) at any time t, the merged filter bank output $y'_j(t)$ that has changed is determined using equation (9). This changed output is then added to the previously determined merged filter bank outputs $y'_j(t)$ which have not changed between t−1 and t (if any). (As discussed below, for L>2 phases there is always one merged filter bank which does not change its value each t.)

Equation (9) can be further simplified. However, the simplification depends on the time t during which the next sample is received More specifically if $(1+L/2) \leq k \leq L$ (where t=w·L+k) then the merged filter bank which changes has only combined, in-phase, cross-symmetric bank filter terms.

In the case that $(1+L/2) \leq k \leq L$:

$$\left\lfloor \frac{t-k}{L} \right\rfloor = \left\lfloor \frac{wL+k-k}{L} \right\rfloor = w$$

$$\left\lfloor \frac{t+k-1}{L} \right\rfloor = \left\lfloor \frac{wL+k-k}{L} \right\rfloor = w + \left\lfloor \frac{2k-1}{L} \right\rfloor = w+1$$

Thus if $(1+L/2) \leq k \leq L$, then $$\left\lfloor \frac{t-k}{L} \right\rfloor = \left\lfloor \frac{t+k-1}{L} \right\rfloor - 1 \quad (12)$$

Equation (9) can be re-written as (assuming n and L are even):

$$y'_j(t) = \sum_{i=0}^{U-1} P_k(i) \cdot X\left(\left\lfloor \frac{t-k}{L} \right\rfloor - i\right) + \quad (13)$$

$$\sum_{i=U}^{n-1} P_k(i) \cdot X\left(\left\lfloor \frac{t-k}{L} \right\rfloor - i\right) +$$

$$\sum_{i=0}^{U-1} P_{L-k+1}(i) \cdot X\left(\left\lfloor \frac{t+k-1}{L} \right\rfloor - i - 1\right) +$$

$$\sum_{i=U}^{n-1} P_{L-k+1} \cdot X\left(\left\lfloor \frac{t+k-1}{L} \right\rfloor - i - 1\right)$$

Combining equations (12) and (13) produces:

$$y'_j(t) = \sum_{i=0}^{U-1} (P_k(i) + P_{L-k+1}(i)) \cdot \left[ X\left(\left\lfloor \frac{t-k}{L} \right\rfloor - i\right) + \quad (14) \right.$$

$$\left. X\left(\left\lfloor \frac{t-k}{L} \right\rfloor - (n-i-1)\right) \right]$$

In the case that $1 \leq k \leq L/2$:

$$\left\lfloor \frac{t-k}{L} \right\rfloor = \left\lfloor \frac{wL+k-k}{L} \right\rfloor = w$$

$$\left\lfloor \frac{t+k-1}{L} \right\rfloor = \left\lfloor \frac{wL+k+k-1}{L} \right\rfloor = w + \left\lfloor \frac{2k-1}{L} \right\rfloor$$

Thus, if $1 \leq k \leq L/2$, then $$\left\lfloor \frac{t-k}{L} \right\rfloor = \left\lfloor \frac{t+k-1}{L} \right\rfloor \quad (15)$$

Combining equations (13) and (15) produces:

$$y'_j(t) = P_k(0) \cdot \left[ X\left(\left\lfloor \frac{t-k}{L} \right\rfloor\right) + \quad (16) \right.$$

$$X\left(\left\lfloor \frac{t+k-1}{L} \right\rfloor - n\right) \left. \right] +$$

$$\sum_{i=1}^{U-2} (P_k(i) + P_{L-k+1}(i-1)) \cdot \left[ X\left(\left\lfloor \frac{t-k}{L} \right\rfloor - i\right) + \right.$$

$$\left. X\left(\left\lfloor \frac{t-k}{L} \right\rfloor - (n-i)\right) \right] + 2P_k(U-1) \cdot$$

$$X\left(\left\lfloor \frac{t-k}{L} \right\rfloor - U + 1\right)$$

In equation (16), the first and last addends result from the out of phase bank filter terms (which have no cross-symmetric bank filter terms).

When either n and L are not even, the equations (14) and (16) will be slightly modified with different addends.

Figure 7:
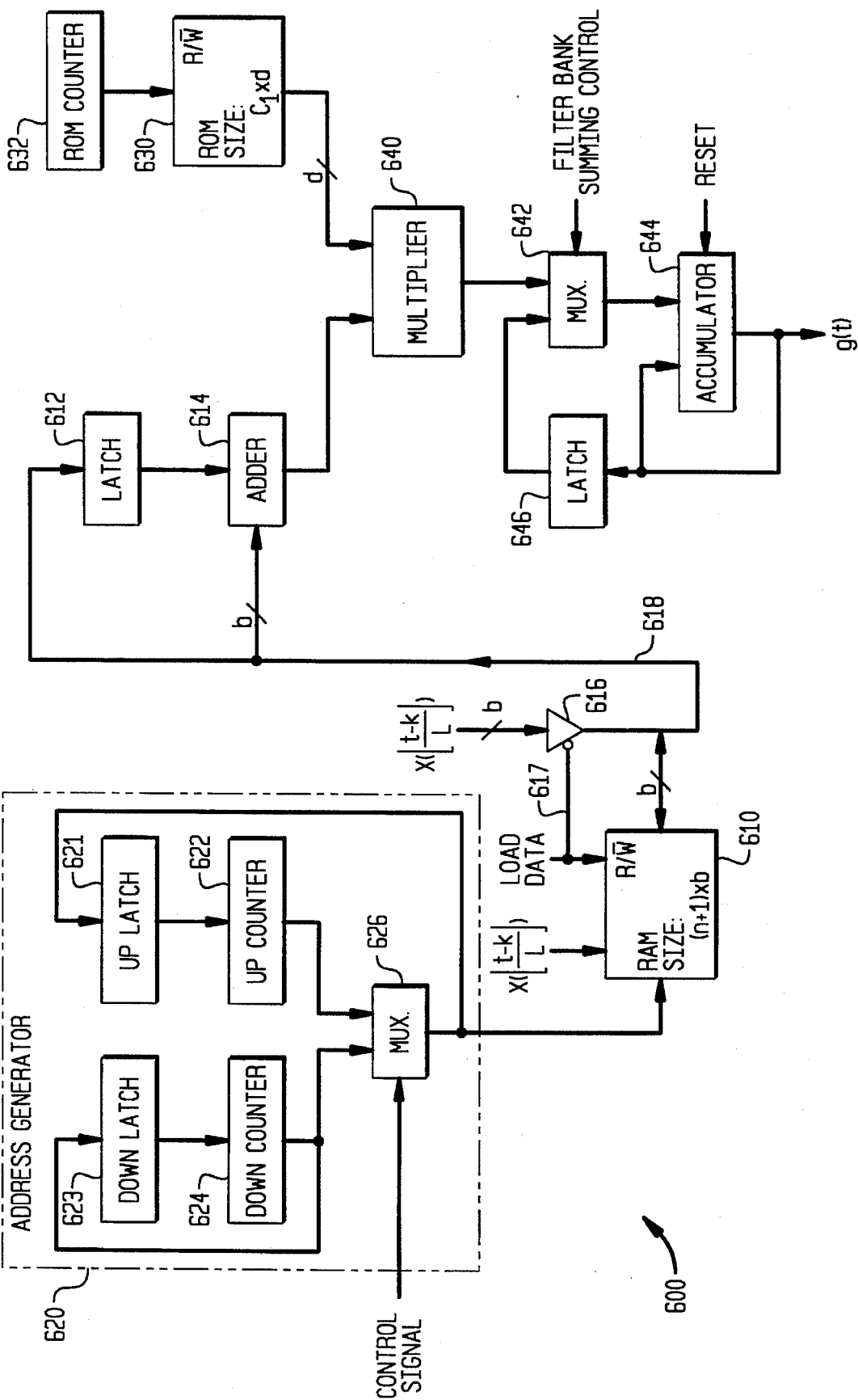
FIG. 7 shows a FIR filter interpolator according to a first embodiment of the present invention.

FIG. 7 shows an illustrative FIR filter interpolator circuit according to one embodiment of the present invention. The interpolator 600 has a RAM 610 for receiving and storing inputted samples $$X\left(\left\lfloor \frac{t-k}{L} \right\rfloor - i\right).$$

The RAM 610 has capacity for storing n+1 samples from $$X\left(\left\lfloor \frac{t-k}{L} \right\rfloor - i\right) \text{ to } X\left(\left\lfloor \frac{t-k}{L} \right\rfloor - i - n\right).$$

Illustratively each sample has b bits. The RAM 610 receives a new value $X(\lfloor t-K/L \rfloor - n)$ every L phases of the time t.

An address generator 620 is connected to the RAM 610. The address generator illustratively includes a loadable up-counter 622 and a loadable down-counter 624. An up-counter latch 621 is connected to the output of a multiplexer 626 and the output of the latch 621 is fed to an input of the up-counter 622. A down-counter latch 623 is connected to the output of the down-counter 624 and the output of the latch 623 is fed to an input of the down-counter 624. A multiplexer 626 is provided for selecting the output of the up-counter 622 or down-counter 624 depending on an external control signal. The output of the multiplexer 626 is outputted to the address port of the RAM 610. Illustratively, a two-phase clock is used for causing the up-counter 622 to count up and for causing the down-counter 624 to count down.

The output of the RAM 610 is connected to a latch 612 and one input of an adder 614. The output of the latch 612 is connected to a second input of the adder 614. The sample addressed in the RAM 610 by the address generator 620 can be selectively outputted to the adder 614 or latch 612.

A ROM 630 is provided for storing a tap coefficient value for each merged bank filter term (i.e., the sum of tap coefficients of cross-symmetric bank filter terms and two tap coefficients for out of phase merged bank filter terms). The ROM 630 must have a capacity of C·d where the tap coefficients can have a d bit precision and where $C = L \cdot n/2 + L/2$. For n=4 and L=4 the ROM 630 has a minimum capacity of 10d. However, a ROM 630 with a capacity of 14d is illustratively provided. The extra capacity is used to store 0 value separators between tap coefficient values corresponding to each merged filter bank. This simplifies the control as illustrated below. The address generator for the ROM 630 is a counter 632, which may be a simple up-counter.

The tap coefficients, and sums of tap coefficients, addressed by the ROM counter 632 are outputted from the ROM 630 to a multiplier 640. The multiplier 640 also receives the sum of samples outputted from the adder 614 as an input. The multiplier 640 multiplies each sum of samples outputted from the adder 614 with its corresponding tap coefficient value outputted from the ROM 630. The product thus formed is a merged bank filter term and is outputted from the multiplier 640 to a multiplexer 642. The multiplexer 642 has an output connected to an accumulator 644. The accumulator 644 has an output which feeds back as a second input to the accumulator 644. Using this interconnection of the multiplexer 642 and accumulator 644, it is possible to add up a sequence of products, i.e., merged bank filter terms, outputted from the multiplier 640 to produce the output $y'_j(t)$ of a merged filter bank. To that end, the accumulator 644 is first reset. Then, a filter bank summing control signal (generated by a control circuit not shown) causes the multiplexer 642 to select the products outputted from the multiplier 640. These products are added one at a time to the current sum stored in the accumulator 644 by virtue of the feedback connection from the output of the accumulator 644 to the second input of the accumulator 644. In addition, the accumulator output is connected to a latch 646. The output of the latch is connected as a second input to the multiplexer 642. A merged filter bank output $y'_j(t)$ formed in the accumulator 644 may be stored in the latch 646. At a later time t+1, this merged filter bank output $y'_j(t)$ may be added to another merged filter bank output $y'_{j'}(t+1)$ formed in the accumulator 644.

For n=4 tap coefficients per filter bank and L=4 filter banks, there are 16 tap coefficients $P_1(0), \ldots, P_1(3), P_2(0), \ldots, P_22(3), \ldots, P_4(3)$. However, there are only 8 unique tap coefficient values $h_0$–$h_7$ taken from a function such as is shown in FIG. 8. These unique coefficient values $h_0$–$h_7$ are assigned to each filter bank as summarized in Table 1 below:

TABLE 1

| value | $h_0$ | $h_1$ | $h_2$ | $h_3$ | $h_4$ | $h_5$ | $h_6$ | $h_7$ |
|---|---|---|---|---|---|---|---|---|
| tap | $P_1(0)$ | $P_2(0)$ | $P_3(0)$ | $P_4(0)$ | $P_1(1)$ | $P_2(1)$ | $P_3(1)$ | $P_4(1)$ |
| tap | $P_4(3)$ | $P_3(3)$ | $P_2(3)$ | $P_1(3)$ | $P_4(2)$ | $P_3(2)$ | $P_2(2)$ | $P_1(2)$ |

After substituting these tap coefficients $h_0$–$h_7$ into equations (11) and (12), the following merged filter bank characteristics change between each t and t−1:

TABLE 2

| Between t and t − 1 | changed merged filter banks |
|---|---|
| t = 1 and t = 0 | $y'_1(1) = y_1(1) + y_4(1) = h_0(X(0) + X(-4)) + (h_3 + h_4)(X(-1) + X(-3)) + 2h_7X(-2)$ |
| t = 2 and t = 1 | $y'_2(2) = y_2(2) + y_3(2) = h_1(X(0) + X(-4)) + (h_2 + h_5)(X(-1) + X(-3)) + 2h_6X(-2)$ |
| t = 3 and t = 2 | $y'_2(3) = y_2(3) + y_3(3) = (h_1 + h_2)(X(0) + X(-3)) + (h_5 + h_6)(X(-1) + X(-2))$ |
| t = 4 and t = 3 | $y'_1(4) = y_1(4) + y_4(4) = (h_0 + h_3)(X(0) + X(-3)) + (h_4 + h_7)(X(-1) + X(-2))$ |
| t = 5 and t = 4 | $y'_1(5) = Y_1(5) + y_4(5) = h_0(X(1) + X(-3)) + (h_3 + h_4)(X(0) + X(-2)) + 2h_7X(-1)$ |
| t = 6 and t = 5 | $y'_2(6) = y_2(6) + y_3(6) = h_1(X(1) + X(-3)) + (h_2 + h_5)(X(0) + X(-2)) + 2h_6X(-1)$ |
| t = 7 and t = 6 | $y'_2(7) = y_2(7) + y_3(7) = (h_1 + h_2)(X(1) + X(-2)) + (h_5 + h_6)(X(0) + X(-1))$ |
| ... | ... |

It may be appreciated that g(t) can be determined by adding the merged filter bank output $y'_j(t)$ which changes between t−1 and t to the merged filter bank outputs $y'_1(t)$, $y'_2(t), \ldots, y'_{j-1}(t), y'_{j+1}(t), y'_{j+2}(t), \ldots, y'_J(t)$ which do not change between t−1 and t. In the case of L=4, there are only two merged filter banks. Thus, one filter bank output changes $y'_j(t)$ between t−1 and t and one filter bank output $y'_{j'}(t)$ does not change.

Figure 9A:
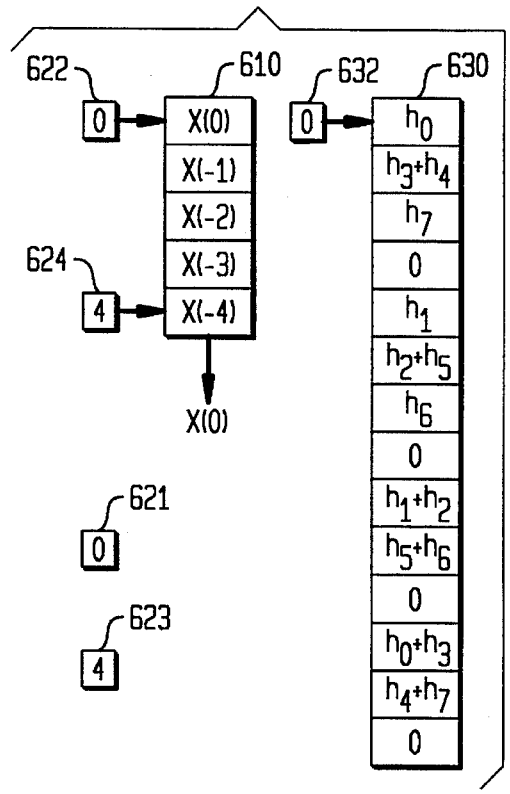
FIGS. 9(a)–(z), (a1), (a2), (a3) and (a4) illustrate the state of counters of the FIR filter interpolator of FIG. 7.
Figure 9B:
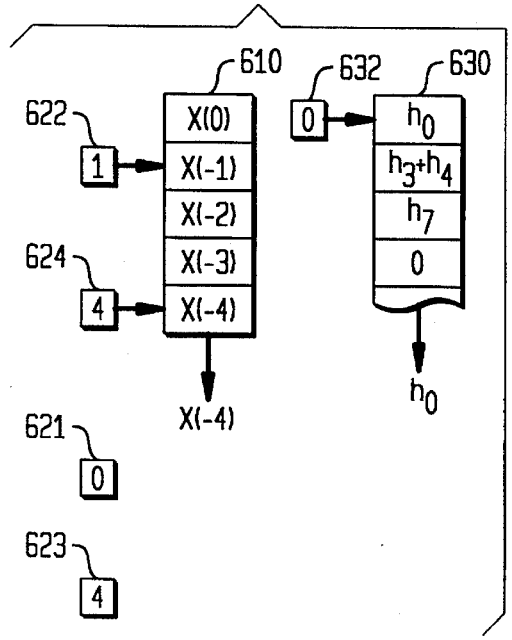
Figure 9C:
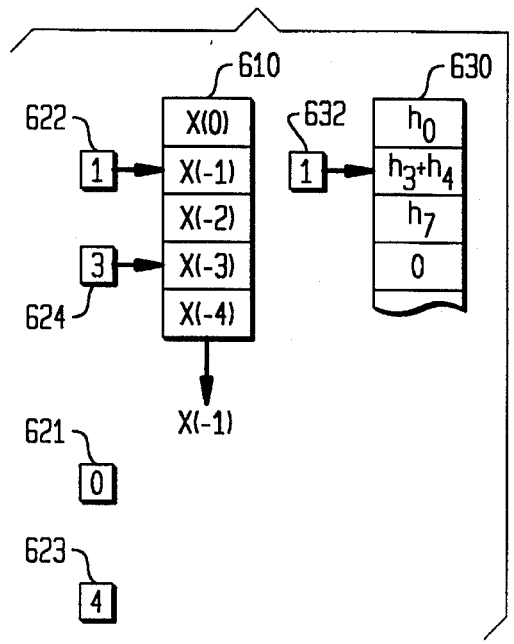
Figure 9D:
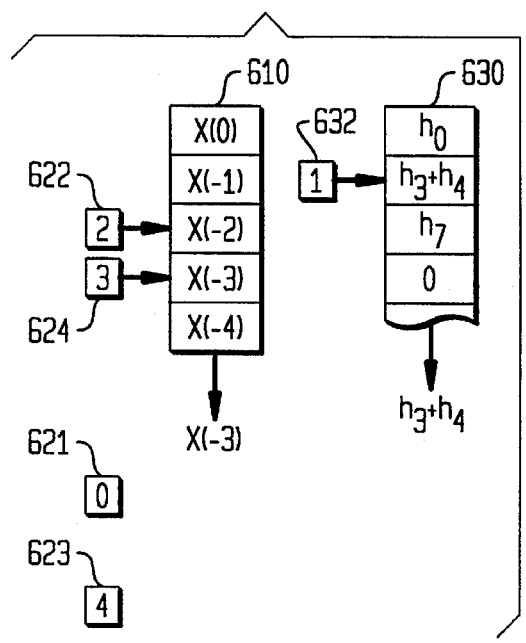
Figure 9E:
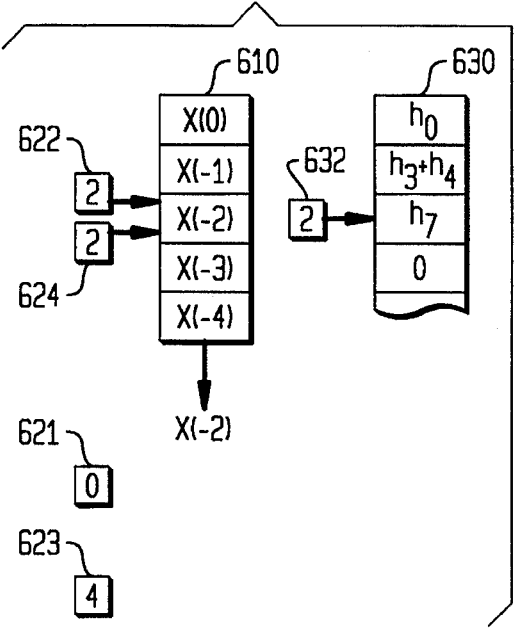
Figure 9F:
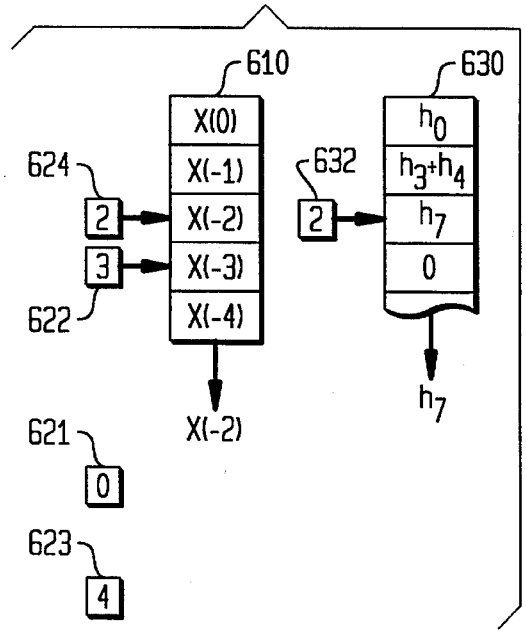
Figure 9G:
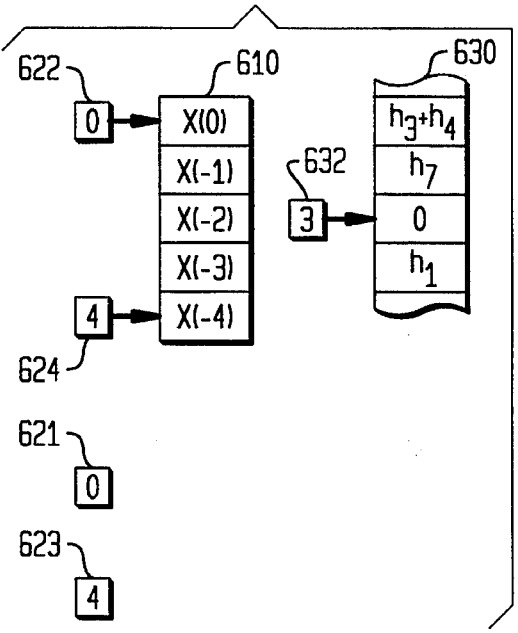
Figure 9H:
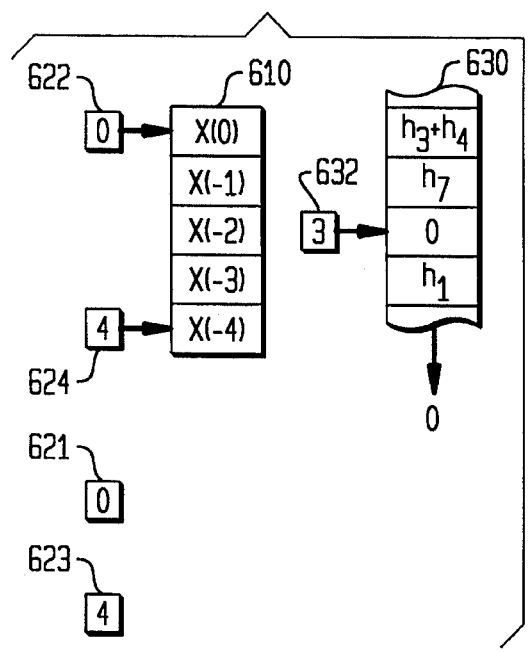
Figure 9I:
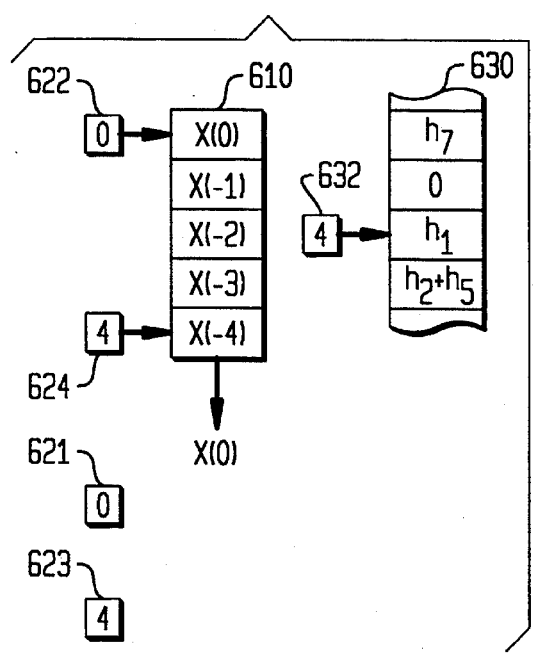
Figure 9J:
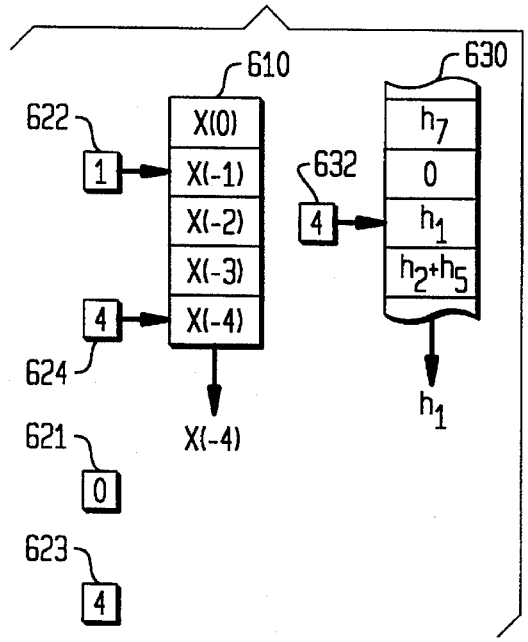
Figure 9K:
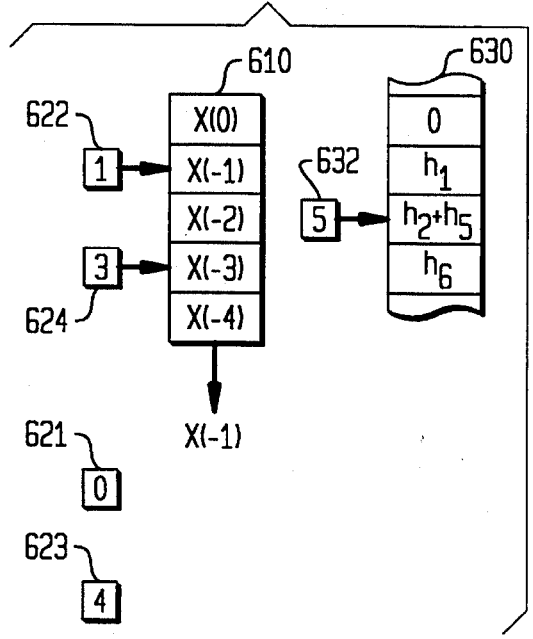
Figure 9L:
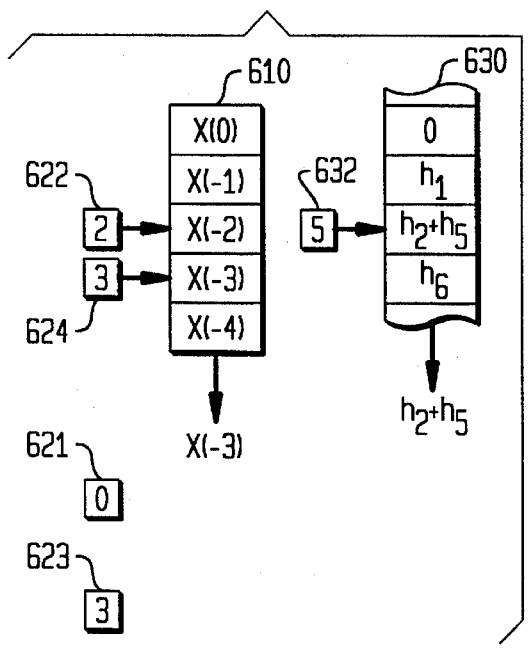
Figure 9M:
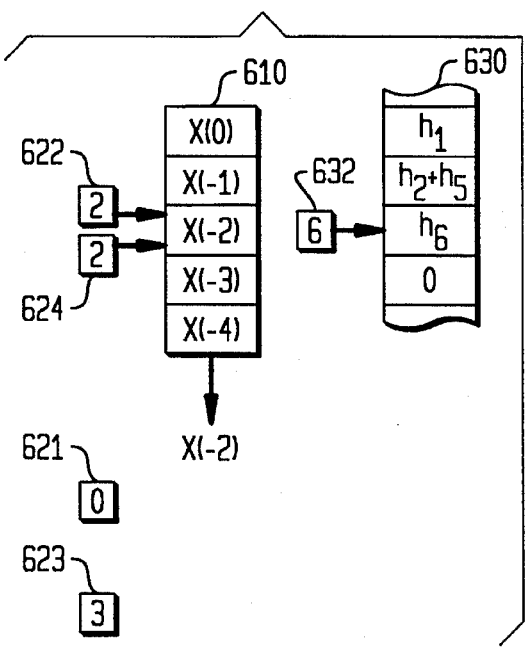
Figure 9N:
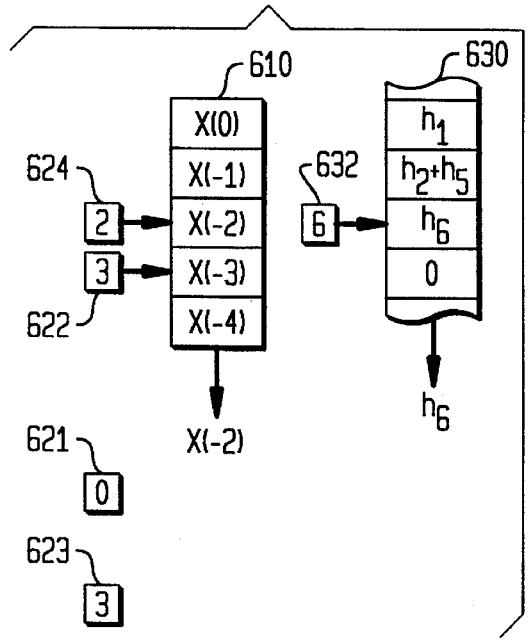
Figure 9O:
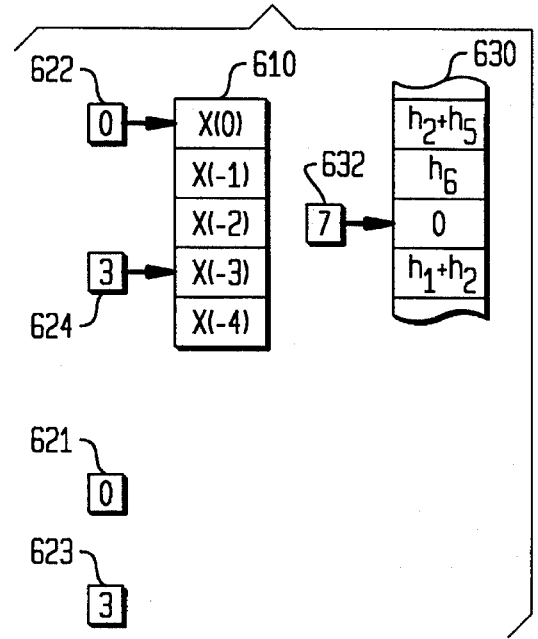
Figure 9P:
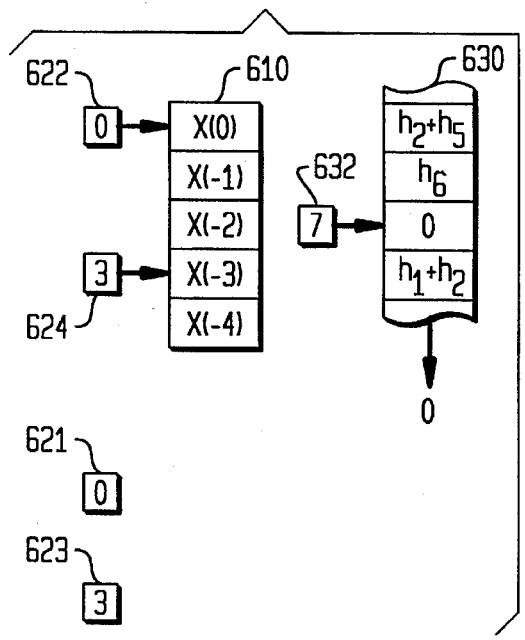
Figure 9Q:
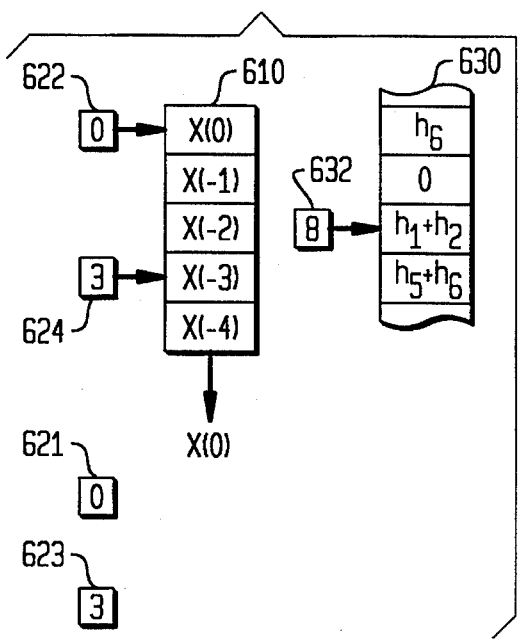
Figure 9R:
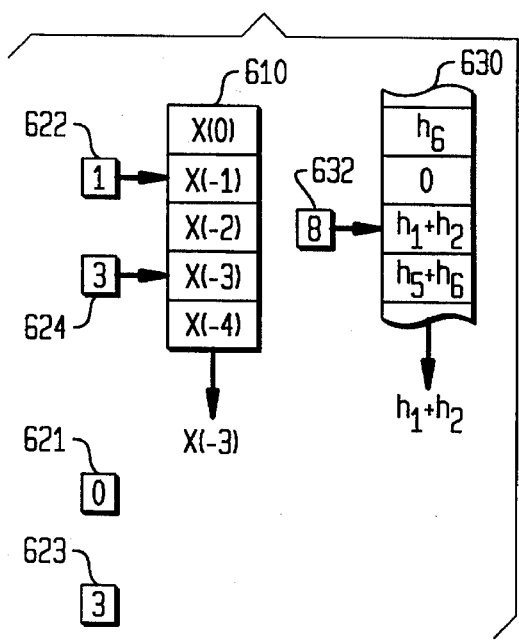
Figure 9S:
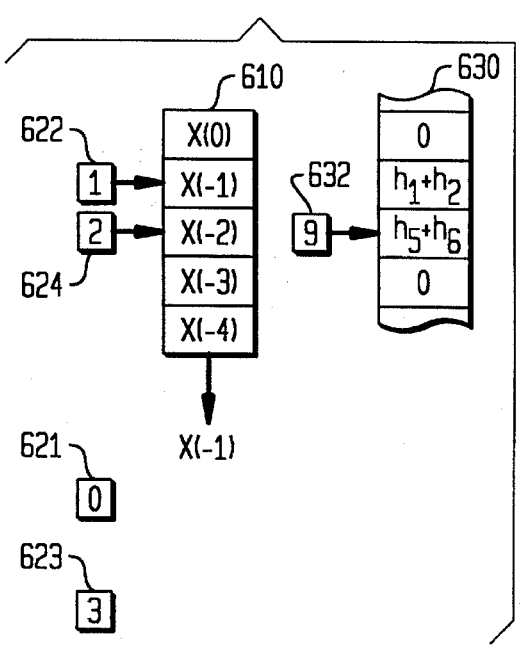
Figure 9T:
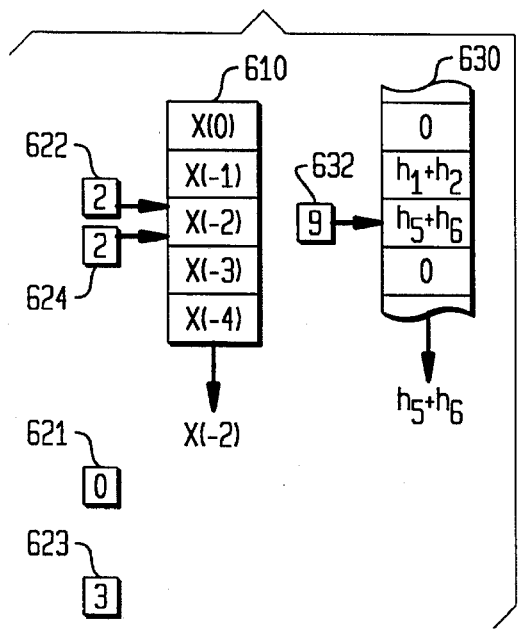
Figure 9U:
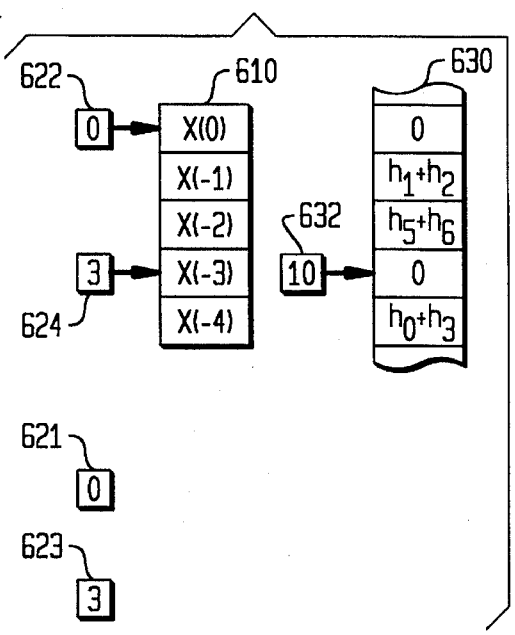
Figure 9V:
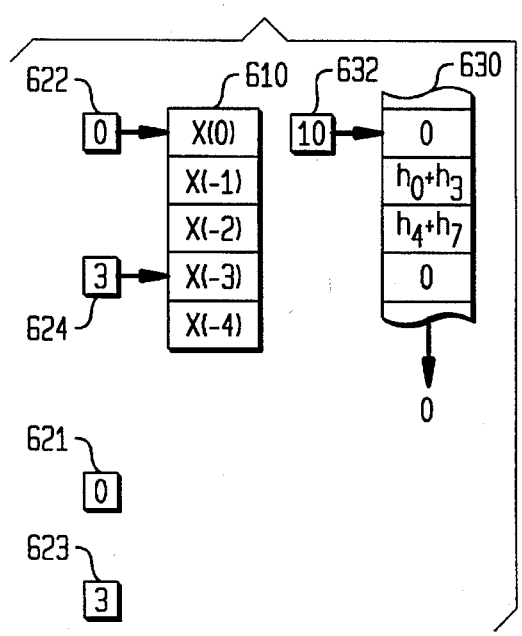
Figure 9W:
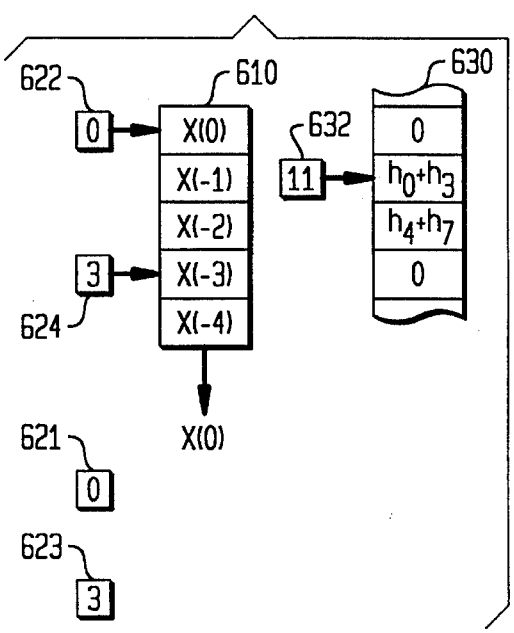
Figure 9X:
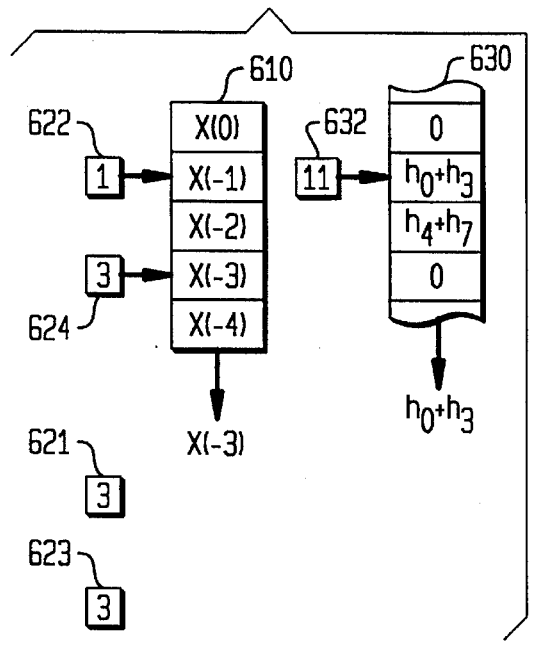
Figure 9Y:
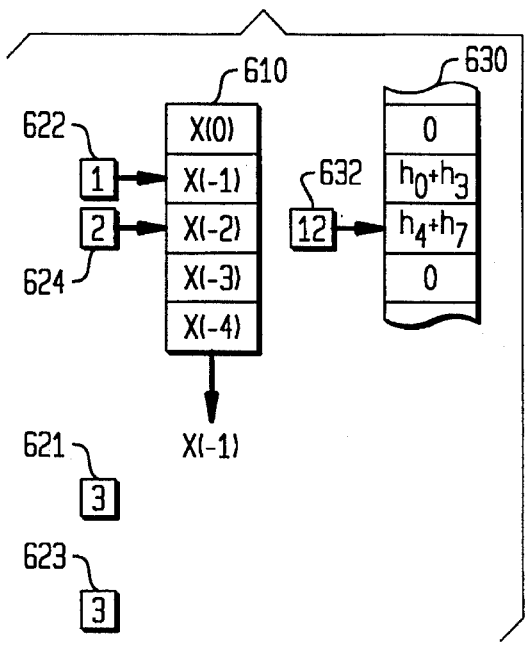
Figure 9Z:
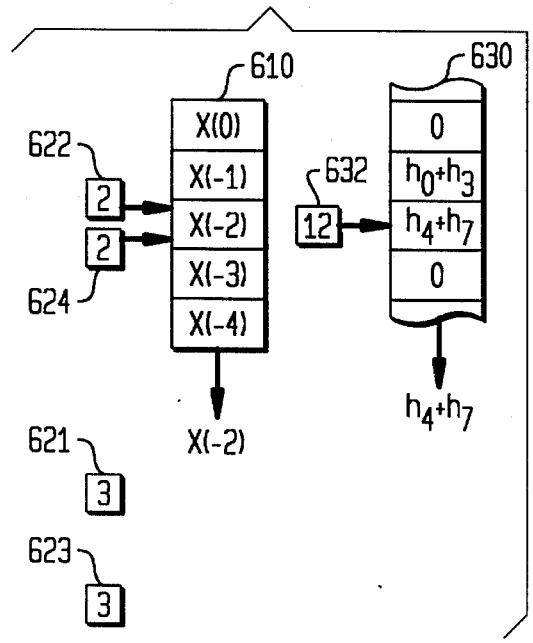
Figure 9Z:
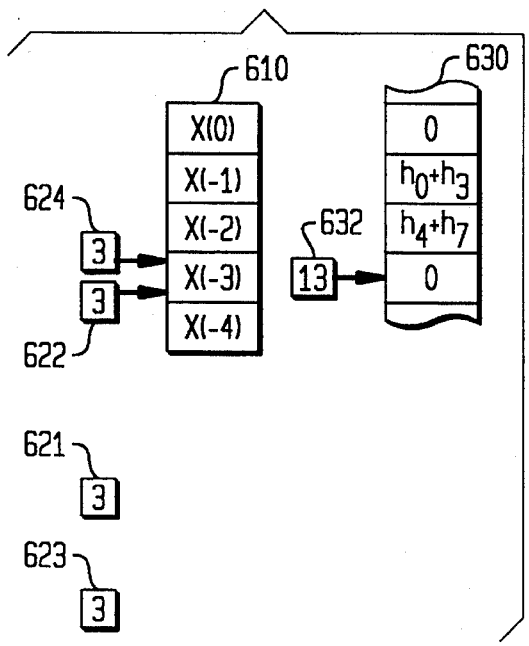

The operation of the invention is now discussed for the case of L=4 and n=4 in connection with FIGS. 9(a)–(z), (a1), (a2), (a3), (a4). Initially, the state of the counters 622, 624 and 632, RAM 610 and ROM 630 is as depicted in FIG. 9(a). The ROM has 14 storage cells storing tap coefficients and sums of tap coefficients for cross-symmetric bank filter terms. The tap coefficients or sums of tap coefficients are grouped according to changed merged filter banks as shown in Table 2. The groups are separated by 0 values. The RAM 610 has n+1 or 5 storage cells which initially store five samples X(0), X(−1), X(−2), X(−3) and X(−4). Every L time periods of the time t, a new sample $X(\lfloor t-k/L \rfloor-i)$ is shifted into the storage cell of the RAM 610 which keeps the earliest sample. The ROM counter 632 is initialized to point to the first ROM 630 cell (i.e., to 0), the up-counter 622 is initialized to point to the first RAM 610 cell (i.e., to 0) and the down-counter 624 is initialized to point to the last RAM 610 cell (i.e., to 4). The up-counter latch 621 and down-counter latch 623 are initialized to 0 and 4 respectively.

During a first phase of a first clock pulse (FIG. 9(a)), the multiplexer 626 selects the count of the up-counter 622 for addressing the RAM 610. The RAM 610 thus outputs the sample X(0) pointed to by the up-counter 622. The sample X(0) is stored in the latch 612.

During a second phase of the first clock pulse (FIG. 9(b)), the up-counter 622 counts up to 1. The multiplexer 626 selects the count of the down-counter 624 for addressing the RAM 610. In response, the RAM 610 outputs the sample X(−4). The adder 614 adds the sample X(−4) to the sample X(0) stored in the latch 612. The adder 614 outputs the sum X(0)+X(−4) to the multiplier 640. Furthermore, the ROM 630 outputs the value $h_0$ addressed by the ROM counter 632 to the multiplier 640. The multiplier 640 multiplies $h_0$ with the sum X(0)+X(−4) and outputs the product (i.e., bank filter term) $h_0(X(0)+X(-4))$ to the multiplexer 642. The multiplexer outputs the product $h_0(X(0)+X(-4))$ to the accumulator 644.

On the first phase of the second cycle (FIG. 9(c)), the multiplexer 626 selects the count of the up-counter 622 for addressing the RAM 610. In response, the RAM 610 outputs the sample X(−1) which is stored in the latch 612. Meanwhile, the down-counter counts down to 3 and the ROM counter 632 counts up to 1.

On the second phase of the second cycle (FIG. 9(d)), the multiplexer 626 selects the count of the down-counter 624 for addressing the RAM 610. In response, the RAM 610 outputs the sample X(−3) which is added by the adder 614 to the sample X(−1) stored in the latch 612. Meanwhile, the ROM 630 outputs the combination (i.e., sum) of tap coefficients $h_3+h_4$ addressed by the counter 632. The sum $h_3+h_4$ is multiplied with the sum X(−1)+X(−3) in the multiplier 640 and the product $(h_3+h_4)(X(-1)+X(-3))$ thus formed is outputted to the multiplexer 642. The multiplexer 642 selects the product $(h_3+h_4)(X(-1)+X(-3))$ outputted from the multiplier 640 for input to the accumulator 644. The accumulator 644 adds the product $(h_3+h_4)(X(-1)+X(-3))$ to the product $h_0(X(0)+X(-4))$ already stored therein.

On the first phase of the third cycle, (FIG. 9(e)), the multiplexer 626 selects the count of the up-counter 622 for addressing the RAM 610. In response, the RAM 610 outputs the sample X(−2) which is stored in the latch 612. Meanwhile, the down-counter counts down to 2 and the ROM counter 632 counts up to 2.

On the second phase of the third cycle (FIG. 9(f)), the multiplexer 626 selects the count of the down-counter 624 for addressing the RAM 610. In response, the RAM 610 outputs the sample X(−2) which is added by the adder 614 to the sample X(−2) stored in the latch 612. Meanwhile, the ROM 630 outputs the tap coefficient $h_7$ which is addressed by the ROM counter 632. The tap coefficient $h_7$ is multiplied with 2X(−2) in the multiplier 640 and the product $2h_7X(-2)$ thus formed is outputted to the multiplexer 642. The multiplexer 642 selects the product $2h_7X(-2)$ outputted from the multiplier 640 for input to the accumulator 644. The accumulator 644 adds the product $2h_7X(-2)$ to the sum of products $(h_3+h_4)(X(-1)+X(-3))+h_0(X(0)+X(-4))$ already stored therein. Thus, the accumulator 644 produces the output $y'_1(1)$.

On the first phase of the fourth cycle (FIG. 9(*g*)), the up and down-counters 622 and 624 load the counts stored in the respective latches 621 and 623 connected thereto. Furthermore, the ROM counter 632 counts down to 3. The sum of products $2h_7X(-2)+(h_3+h_4)(X(-1)+X(-3))+h_0(X(0)+X(-4))$ stored in the accumulator 644 is outputted to the latch 646 where it is stored. This sum of products represents the portion of g(t+1) which does not change between t and t+1. That is, the merged filter bank output $y'_1(t)$ does not change between t=1 and t+1=2.

On the second phase of the fourth cycle (FIG. 9(*h*)), the ROM counter 632 addresses the ROM 630. However, the addressed value is 0 and thus, only a 0 value is outputted from the multiplier 640.

On the first phase of the fifth cycle (FIG. 9(*i*)), the multiplexer 626 selects the count of the up-counter 622 for addressing the RAM 610. This causes the sample X(0) to be outputted from the RAM 610 and stored in the latch 612. The ROM counter 632 counts up to 4.

On the second phase of the fifth cycle (FIG. 9(*j*)), the multiplexer 626 selects the count of the down-counter 624 for addressing the RAM 610. This causes the sample X(-4) to be outputted from the RAM 610 to the adder 614. The adder adds the sample X(-4) to the sample X(0) stored in the latch 612 and outputs the sum X(-4)+X(0) to the multiplier 640. The ROM counter 632 addresses the ROM 630 thereby causing the value $h_1$ to be outputted to the multiplier 640. The multiplier 640 multiplies the value $h_1$ with the sum X(-4)+X(0) and outputs the product $h_1(X(-4)+X(0))$ to the multiplexer 642. The multiplexer 642 outputs the product $h_1(X(-4)+X(0))$ to the accumulator 644 where the product is stored.

On the first phase of the sixth cycle (FIG. 9(*k*)), the multiplexer 626 selects the count of the up-counter 622 for addressing the RAM 610. This causes the sample X(-1) to be outputted from the RAM 610 and stored in the latch 612. The ROM counter 632 counts up to 5. Furthermore, the down-counter 624 counts down to 3.

On the second phase of the sixth cycle (FIG. 9(*l*)), the multiplexer 626 selects the count of the down-counter 624 for addressing the RAM 610. This causes the sample X(-3) to be outputted from the RAM 610 to the adder 614. The adder adds the sample X(-3) to the sample X(-1) stored in the latch 612 and outputs the sum X(-3)+X(-1) to the multiplier 640. The ROM counter 632 addresses the ROM 630 thereby causing the value $h_2+h_5$ to be outputted to the multiplier 640. The multiplier 640 multiplies the value $h_2+h_5$ with the sum X(-3)+X(-1) and outputs the product $(h_2+h_5)(X(-3)+X(-1))$ to the multiplexer 642. The multiplexer 642 outputs the product $(h_2+h_5)(X(-3)+X(-1))$ to the accumulator 644 where the product is added to the product $h_1(X(-4)+X(0))$ already stored therein. The count of the down-counter 634 is stored in the latch 623.

On the first phase of the seventh cycle (FIG. 9(*m*)), the multiplexer 626 selects the count of the up-counter 622 for addressing the RAM 610. This causes the RAM 610 to output the sample X(-2) which is stored in the latch 612. The ROM counter 632 counts up to 6. Furthermore, the down-counter counts down to 2.

On the second phase of the seventh cycle (FIG. 9(*n*)), the multiplexer 626 selects the count of the down-counter 624 for addressing the RAM 610. This causes the RAM 610 to output the sample X(-2) to the adder 614. The adder 614 adds the sample X(-2) to the sample X(-2) stored in the latch 612 and outputs the value 2X(-2) to the multiplier 640. Meanwhile, the ROM counter 632 addresses the ROM 630 thereby causing the ROM 630 to output the value $h_6$ to the multiplier 640. The multiplier 640 multiplies the value $h_6$ with the value 2X(-2) and outputs the product $2h_6X(-2)$ to the multiplexer 642. The multiplexer 642 outputs the product $2h_6X(-2)$ to the accumulator 644 where it is added to the sum of products $(h_2+h_5)(X(-3)+X(-1))+h_1(X(-4)+X(0))$ already stored therein. The sum $(h_2+h_5)(X(-3)+X(-1))+h_1(X(-4)+X(0))+2h_6X(-2)$ produced in the accumulator 644 is the output of the merged filter bank $y'_2(t)$.

On the first phase of the eighth cycle (FIG. 9(*o*)), the up-counter 622 and the down-counter 624 load the counts stored in the respective latches 621 or 623 connected thereto. However, unlike the first phase of the first cycle (FIG. 9(*a*)) and the first phase of the fourth cycle (FIG. 9(*g*)), the count inputted to the down-counter 624 is 3. (This count was stored in the latch 623 during the second phase of the sixth cycle). The ROM counter 632 counts up to 7.

The multiplexer 642 selects the sum corresponding to the unchanged portion of g(2) for input to the accumulator 644. As a result, the accumulator adds the unchanged filter bank outputs $y'_1(1)$ to the recently calculated changed filter bank output $y'_2(2)$. This sum corresponding to g(2) is outputted from the accumulator 644.

As shown in Table 2, the merged filter bank output $y'_2(t)$ changes again between t=2 and t+1=3, i.e., $y'_2(3)$ is not equal to $y'_2(2)$. However, $y'_1(t)$ does not change between t=2 and t+1=3. Thus, the merged filter bank output $y'_2(2)$ is not saved in the latch 646. Rather, the latch 646 retains the merged filter bank output $y'_1(t)$ for determining g(3).

On the second phase of the eighth cycle (FIG. 9(*p*)), the ROM counter 632 causes the ROM 630 to output the value 0 (which has no effect on the calculation of g(t)).

On the first phase of the ninth cycle (FIG. 9(*q*)), the multiplexer 626 selects the count of the up-counter 622 for addressing the RAM 610. This cause the RAM 610 to output the sample X(0) to the latch 612 where it is stored. The ROM counter 632 counts up to 8.

On the second phase of the ninth cycle (FIG. 9(*r*)), the multiplexer 626 selects the count of the down-counter 624 for addressing the RAM 610. In response, the RAM 610 outputs the sample X(-3) to the adder 614. The adder 614 adds the sample X(-3) to the sample X(0) stored in the latch 612 and outputs the sum X(0)+X(-3) to the multiplier 640. Meanwhile, the ROM counter 632 addresses the ROM 630. In response, the ROM 630 outputs the value $h_1+h_2$ to the multiplier 640. The multiplier 640 multiplies $h_1+h_2$ with X(0)+X(-3) to produce the product $(h_1+h_2)(X(0)+X(-3))$. This product is outputted to the accumulator 644 via the multiplexer 642 where it is stored.

The above process continues in a similar fashion to compute each g(t) as shown in FIGS. 9(*s*)–(*z*), (*a*1), (*a*2), (*a*3), (*a*4). The up-counter 622 and down-counter 624 both count through zero. That is, after counting up to 4, the up-counter 622 counts to 0. Likewise, after counting down to 0, the down-counter 624 counts to 4.

The count of the down-counter 624 is stored in the down-counter latch 623 on the second phase of the sixth cycle (FIG. 9(*l*)). The output of the multiplexer 626 is stored in the up-counter latch 621 on the second phase of the twelfth cycle (FIG. 9(*x*)) and on the first phase of the fifteenth cycle (FIG. 9(*a*3)).

At each time t mod L=1, a new sample $$x\left(\left\lfloor \frac{t-k}{L} \right\rfloor - i\right)$$

is written in the RAM 610. For instance, at t=5, X(1) is shifted into addressed cell 4. When a new sample $$x\left(\left\lfloor \frac{t-k}{L} \right\rfloor - i\right)$$

is written in the RAM 610, an appropriate control signal is transmitted on the control line 617 (low signal). This enables the writing of data into the RAM 610 and enables the transfer of data through the tri-state buffer 616 to the bus 618. Thus an inputted sample $$x\left(\left\lfloor \frac{t-k}{L} \right\rfloor - i\right)$$

is outputted on bus 618 and is written into the RAM 610. After the inputted sample $$x\left(\left\lfloor \frac{t-k}{L} \right\rfloor - i\right)$$

is written, a high signal is transmitted on the control line 617, thereby re-enabling the reading of samples from the RAM 610 and disabling the transfer of data through the tri-state buffer 616.

During subsequent processing, the changed merged filter bank output $y'_2(t)$ determined for t=5 is stored in the latch 646 because this output $y'_2(t)$ does not change between t=5 and t=6. On the other hand, the merged filter bank output $y'_1(t)$ changes between t=5 and t=6 and may be discarded.

Figure 3:
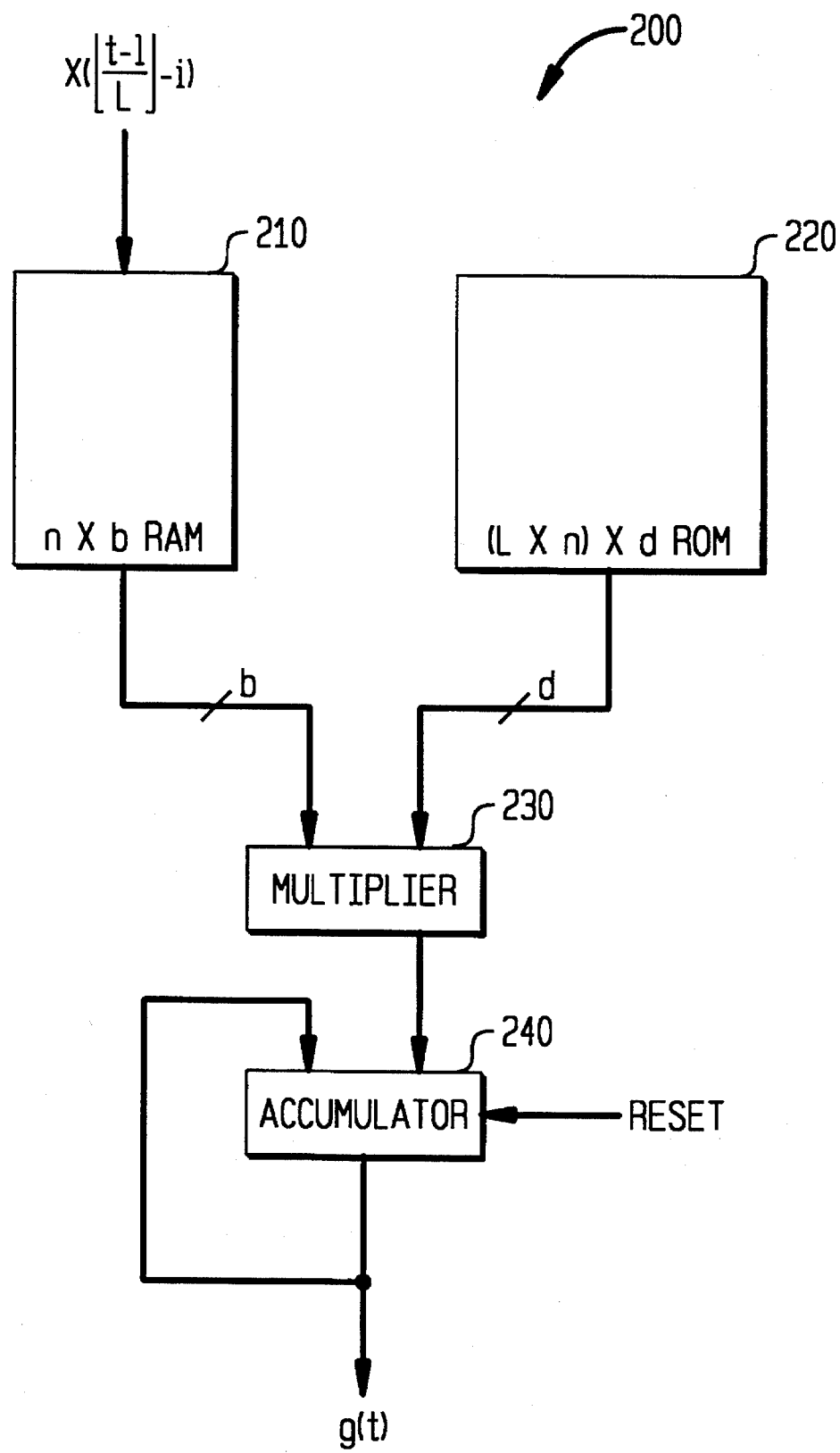
FIG. 3 shows a second conventional FIR filter interpolator.
Figure 4:
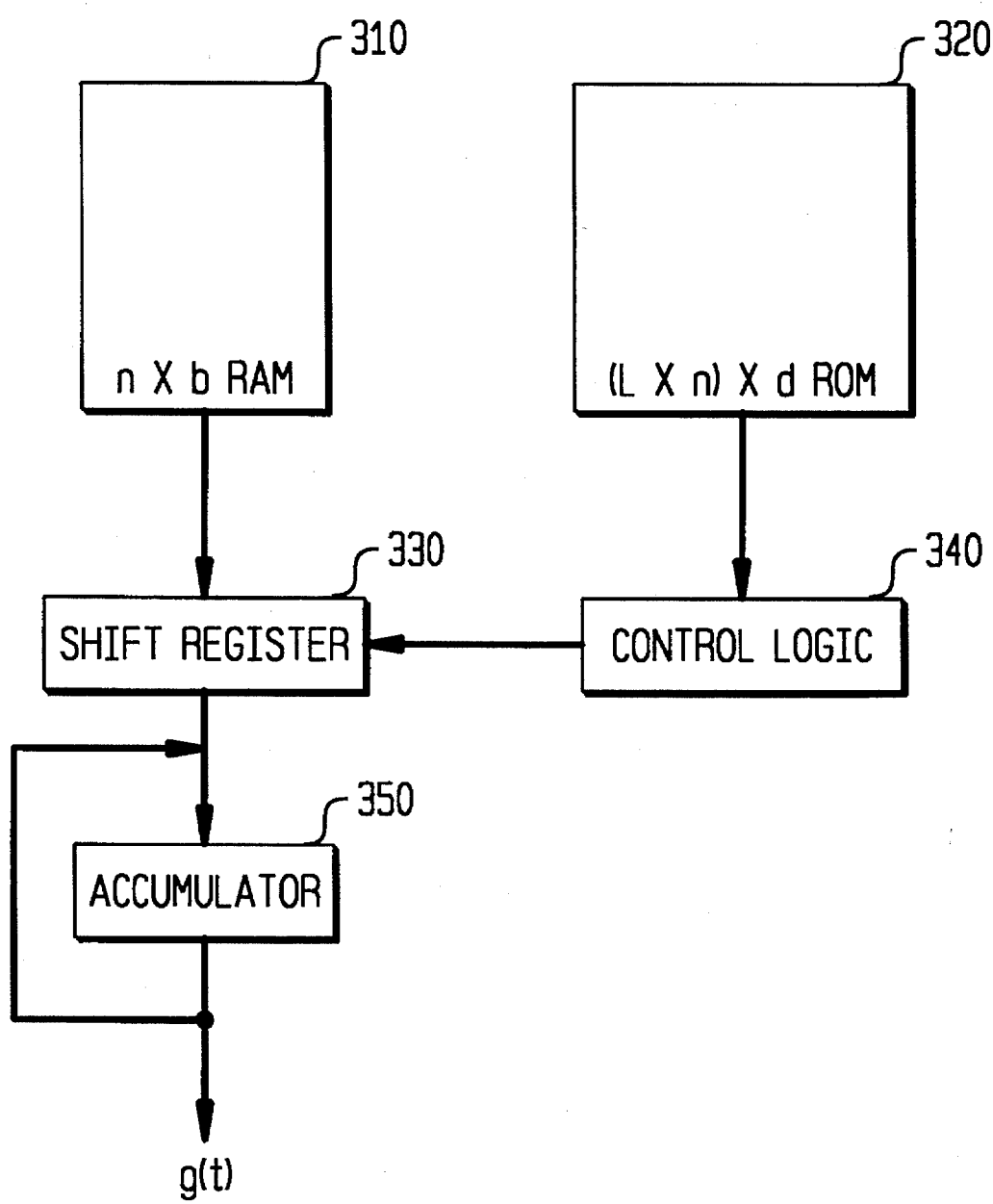
FIG. 4 shows a third conventional FIR filter interpolator.

In calculating each g(t) the interpolator 600 performs n/2 additions for preliminarily adding together samples with the adder 614. However, this can be improved by substituting for the circuits 620, 610, 612 and 614 a circuit which stores the appropriate sums of input samples and outputs them to the multiplier 640 at the appropriate time. In addition, the multiplier 640 performs at most n/2+1 multiplications in multiplying samples with tap coefficients or sums of tap coefficients. The accumulator 644 performs n/2 additions for adding together bank filter terms to form filter bank outputs $y'_j(t)$. Furthermore, the accumulator 644 performs L/2 additions for adding together filter bank outputs $y'_j(t)$ to form g(t). In contrast, the filter 200 (FIG. 3) uses at least n multiplications and n additions to calculate each g(t).

The interpolator 600 has been illustrated for n=4 and L=4. However, an interpolator 600 could be provided for any n and L. In changing n, the size of the RAM 610 and ROM 630 must be accordingly adjusted. In addition, the tap coefficient values stored in the ROM 630 must be recalculated for n and L. Furthermore, the sequencing of the counters 622, 624 and 632, multiplexer 626 and latches 621 and 623 must be suitably modified.

When L=2, there is only one merged filter bank. This filter bank changes between every t−1 and t. Thus, the latch 646 and multiplexer 642 can be removed. Instead, the accumulator is connected directly to the output of the multiplier 640.

For L>4, more than one merged filter bank output $y'_j(t)$ remains unchanged between t−1 and t. Thus, the latch 646 may be replaced with a multiplexer and one latch for storing each unchanged filter bank output $y'_j(t)$. The multiplexer is connected to the output of the accumulator 644 and alternately stores the value produced in the accumulator 644 in each of these latches. Likewise, the multiplexer 642 can be suitably modified to alternately select each unchanged filter bank output $y'_j(t)$ stored in these latches in a round-robin fashion for accumulation with a computed changed filter bank output $y'_j(t)$ in the accumulator 644 to determine each g(t).

Figure 10:
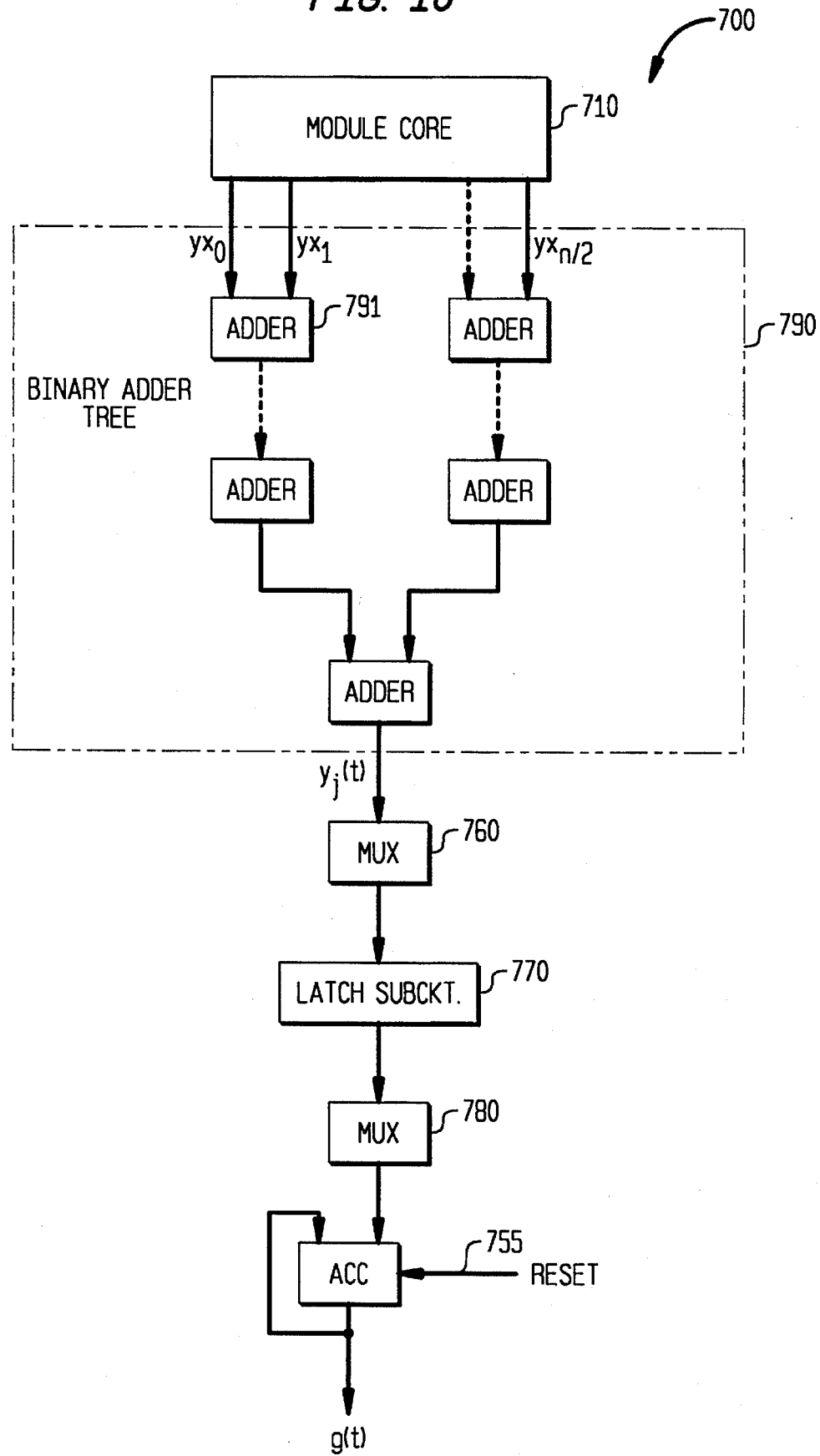
FIG. 10 shows a FIR filter interpolator according to a second embodiment of the present invention.

FIG. 10 shows an interpolator 700 according to a second embodiment of the present invention for use in a video application. The interpolator 700 is similar in some ways to the conventional FIR filter 400 of FIG. 5 in that the interpolator 700 has a module core 710 and a binary adder tree 790 with adders 791. The difference is that instead of merging bit planes (performing calculations using adjacent pairs of $q^{th}$, $(q+1)^{th}$ bits) of the input sample, cross-symmetric bank filter terms are merged to form merged filter banks. Thus, whereas the processing requirements (number of circuits, processing time) of the prior art FIR filter 400 heavily depends on the number of bits b of the input samples, the processing requirements of the interpolator 700 depends on the number of tap coefficients n.

Figure 11:
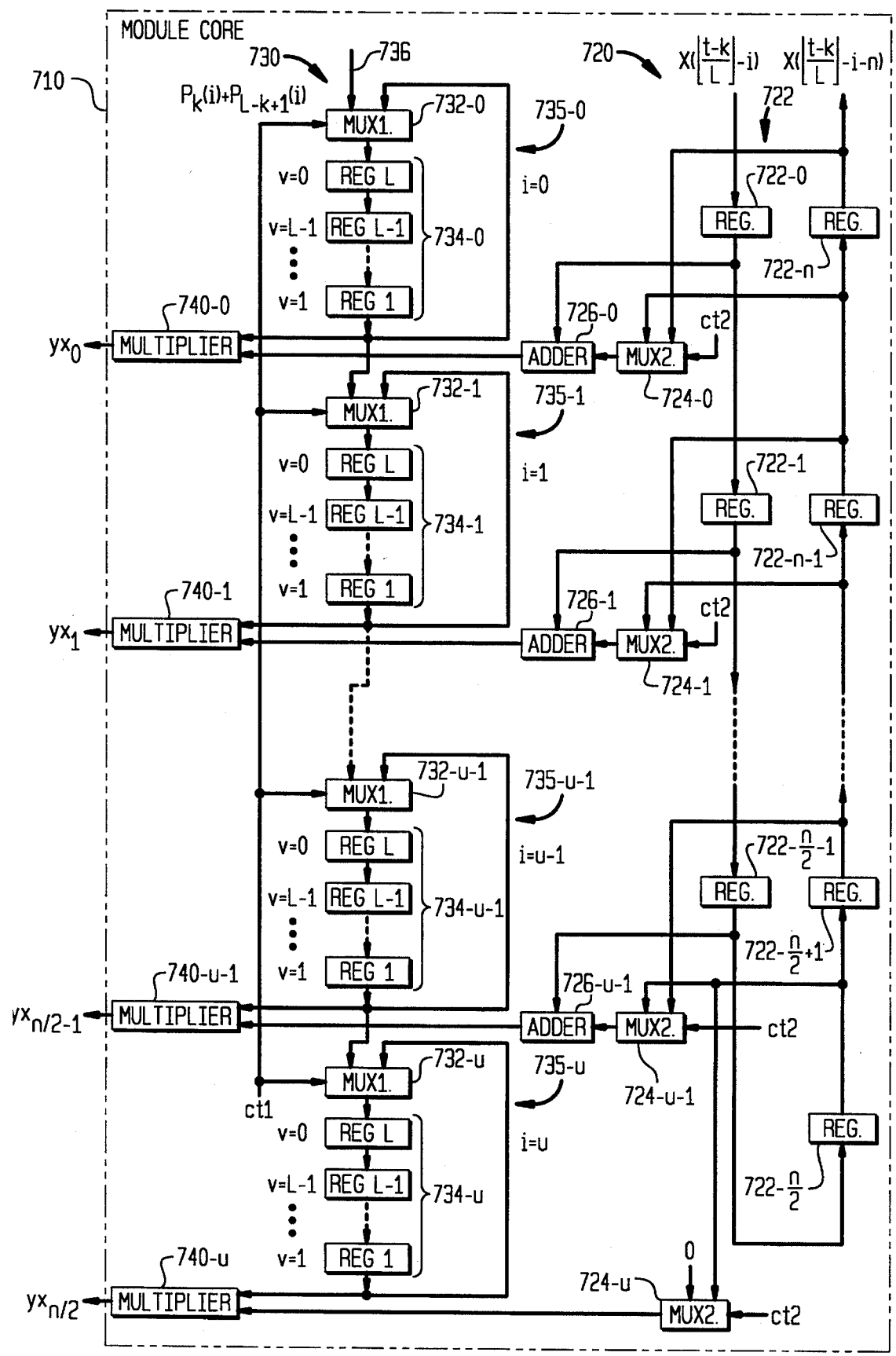
FIG. 11 shows a module core of the FIR filter of FIG. 10.

FIG. 11 shows an embodiment of the module core 710. The module core 710 has a pre-processing stage wherein inputted samples $$x\left(\left\lfloor \frac{t-k}{L} \right\rfloor - i\right)$$

are selectively added together to form sums of samples. The pre-processing stage has a shift register 722 with n+1 registers connected together in tandem. The pre-processing stage 720 also has U+1 multiplexers 724-0, 724-1, ..., 724-u, ..., 724-U (where U=n/2). Each $u^{th}$ multiplexer 724-u (where $0 \leq u \leq U$) except for the multiplexer 724-U, receives as inputs, the samples $$x\left(\left\lfloor \frac{t-1}{L} \right\rfloor - n + u - i + 1\right),$$

$$x\left(\left\lfloor \frac{t-1}{L} \right\rfloor - n + u - i\right)$$

stored in the registers 722-(n−u−1) and 722-n-u. For example, the multiplexer 724-0 receives the samples $$x\left(\left\lfloor \frac{t-1}{L} \right\rfloor - n - i + 1\right), x\left(\left\lfloor \frac{t-1}{L} \right\rfloor - n - i\right)$$

stored in the registers 722-(n−1) and 722-n, respectively. The multiplexer 724-U receives as inputs the value stored in the register 722-n/2 and the value 0. The multiplexers 724-0, ..., 724-U select one of their inputs under the control of an externally generated signal ct2.

The pre-processing stage 720 also has U adders 726-0, 726-1, ..., 726-u, ..., 726-U-1. Each $u^{th}$ adder (where $1 \leq u \leq U-1$) 726-u adds the sample $$x\left(\left\lfloor \frac{t-1}{L} \right\rfloor - u - i\right)$$

stored in the $u^{th}$ register 722-u to the sample selected by the $u^{th}$ multiplexer. These sums of samples are suitable for multiplication with tap coefficient values of corresponding merged filter banks. The sample and sums of samples outputted from the adders 726-0, ..., 726-U-1 and multiplexer 724-U are inputted in parallel to a multiplication stage 730.

The multiplication stage 730 has U+1 tap coefficient selector circuits 735-0, 735-1, ..., 735-u, ..., 735-U which are connected together in tandem. Each selector circuit 735-0, ..., 735-U corresponds to one particular merged bank filter term of each merged filter bank. The selector circuits 735-0, ..., 735-U output one tap coefficient value each per time t in parallel.

Each selector circuit 735-u includes a multiplexer 732-u connected to a shift register 734-u. For example, the selector circuit 735-1 includes a multiplexer 732-1 connected to a shift register 734-1. The multiplexer 732-u selects either the tap coefficient value outputted from its own shift register 734-u or the tap coefficient value outputted from the shift register 734-u-1 of a previous selector circuit 730-u-1 under control of an externally generated signal ct1. (Except for the multiplexer 732-0 which selects either the tap coefficient value outputted from its own shift register 734-0 or the tap coefficient values inputted on line 736.)

The shift register 734-u stores L tap coefficient values, i.e., one tap coefficient value for each merged filter bank. These tap coefficient values are illustratively stored in the same order in each shift register 734-u. The tap coefficient values are fed back to their corresponding multiplexers. Thus, each shift register 734-u cyclically repeats the tap coefficients outputted therefrom every L time periods of the time t.

The multiplication stage 730 also has U+1 multipliers 740-0, 740-1, ..., 740-u, ..., 740-U. These multipliers 740-u may be any kind of multipliers including optimized Booth's algorithm multipliers. Each $u^{th}$ multiplier 740-u receives the output of a corresponding tap coefficient selector 735-u (in particular, the tap coefficient values shifted out of the shift register stage 734-u.) Each of the multipliers 740-0, 740-1, ..., 740-U-1 multiplies the tap coefficient value with the output of the corresponding adder 726-0, 726-1, ..., 726-U-1 of the pre-processing stage 720. The multiplier 740-U multiplies its received tap coefficient value with the output of the multiplexer 724-U.

Each multiplier 740-u outputs a corresponding merged bank filter term $yx_0, yx_1, \ldots, yx_u, \ldots, yx_u$. These merged bank filter terms $yx_0, yx_1, \ldots, yx_u, \ldots, yx_u$ are each received in a corresponding binary adder 791 (FIG. 10) of the binary adder tree 790 (710). The binary adder tree 790 adds up the merged bank filter terms $yx_0, yx_1, \ldots, yx_u, \ldots, yx_u$ for each time t. The binary adder tree 790 outputs $y'_j(t)$.

The latch sub-circuit 760 includes J individual latches (where $J = \lceil L/2 \rceil$). For computing each g(t), first the changed merged bank filter output, $y'_j(t)$, is stored in the $j^{th}$ latch of latch subcircuit 760 as selected by the multiplexer 770. Then, the reset control line 755 is used to clear the accumulator 750.

Second, the multiplexer 780 selects the output of the $j^{th}$ latch for each j from 1 to J, (which stores the $j^{th}$ merged bank filter output value $y'_j(t)$). The selected $j^{th}$ latch output is inputted to one input of the accumulator 750. By accumulating all the merged bank filter output values $y'_j(t)$, the accumulator 750 produces the interpolated sample output g(t).

The operation of the interpolator 700 of FIGS. 10 and 11 is now discussed in greater detail. Assume that the interpolator 700 is an L=4 phase n=4 tap coefficient interpolator which interpolates b bit samples $$X\left(\left\lfloor \frac{t-k}{L} \right\rfloor - i\right)$$

with d bit tap coefficients P. In this case, U=2. Initially, ct1 is set equal to 0. Thus, the multiplexer 732-0 of the multiplier stage selects the tap coefficient values inputted on the input line 736. Each of the other multiplexers 732-1 and 732-2 selects the tap coefficient values outputted from the previous selector circuit 735-0 or 735-1. The shift registers 734-0, 734-1 and 734-2 are then initially loaded with their tap coefficient values via the input line 736. Table 3 summarizes the tap coefficient values loaded into each of the shift registers 734-0, 734-1, and 734-2:

TABLE 3

| Shift register | Tap coefficient values (order of output: left to right) |
|---|---|
| 734-0 | $h_0, h_1, h_1 + h_2, h_0 + h_3$ |
| 734-1 | $h_3 + h_4, h_2 + h_5, h_5 + h_6, h_4 + h_7$ |
| 734-2 | $2h_7, 2h_6, 0, 0$ |

Then, ct1 is set to 1 so that the multiplexers 732-0, 732-1, and 732-2 select the tap coefficient value outputted from the corresponding shift register 734-0, 734-1 and 734-2. The following steps are then repeated every L time periods of the time t. First, the next sample $$X\left(\left\lfloor \frac{t-l}{L} \right\rfloor - i\right)$$

is shifted into the shift register 722 of the pre-processing stage. The signal ct2 is set to 1 so that the multiplexers 724-u select the sample stored in the register 724-(n-u). That is, the multiplexer 724-0 selects the sample stored in the register 722-4, the multiplexer 724-1 selects the sample stored in the register 722-3 and the multiplexer 724-2 selects the sample stored in the register 722-2. As a result, the adder 726-0 adds together the samples stored in the registers 722-0 and 722-4, i.e., X(0)+X(−4). This sum is outputted to the multiplier 740-0. Likewise, the adder 726-1 outputs to the multiplier 740-1 the sum of the samples stored in the registers 722-1 and 722-3, i.e., X(−1)+X(−3). The multiplexer 724-2 outputs the sample stored in the register 722-2 to the multiplier 740-2, i.e., X(−2).

The selector 730-0 outputs the first tap coefficient value therein, i.e., $h_0$, to the multiplier 740-0. The multiplier 740-0 multiplies this modified coefficient with the sum of samples outputted from the adder 726-0. This product is outputted as the first bank filter term $yx_0$. Likewise, the selector 730-1 outputs the first tap coefficient value stored therein, i.e., $h_3+h_4$, to the multiplier 740-1. The multiplier 740-1 multiplies this modified coefficient with the sum of samples outputted from the adder 726-1. This product is outputted as the second bank filter term $yx_1$. The selector 730-2 outputs the first tap coefficient value stored therein, i.e., $2h_7$, to the multiplier 740-2. The multiplier 740-2 multiplies this modified coefficient with the sample outputted from the multiplexer 724-2. This product is outputted as the third bank filter term $yx_2$. The bank filter terms $yx_0, yx_1$, and $yx_2$, are outputted in parallel to the binary adder tree 790.

On each of the next cycles through cycle $\lceil L/2 \rceil$ the multiplexers 724-0, 724-1 and 724-2 select the same samples and the adders 726-0 and 726-1 output the same sums of samples. The selectors 735-0, 735-1 and 735-2 output the tap coefficient value corresponding to that cycle. That is, on the second cycle, the selector 735-0 outputs $h_1$, the selector 735-1 outputs $h_2+h_5$, and the selector 735-2 outputs $2h_6$. The multipliers 740-0, 740-1, and 740-2 multiply the corresponding samples or sums of samples outputted from the multiplexer 724-2 or adders 724-0 and 724-1 to produce the respective bank filter terms $yx_0, yx_1$ and $yx_2$.

Starting on the cycle $\lceil L/2 \rceil+1$, the control signal ct2 is changed to 0. This causes each of the multiplexers 724-u (except the multiplexer 724-U) to select the sample stored in the register 722-n-u-1 for input to the adder 726-u. That is, the multiplexer 724-0 selects the sample stored in the register 722-3 and the multiplexer 724-1 selects the sample stored in the register 722-2. The multiplexer 724-2 selects the value 0. Thus the adder 726-0 outputs the sum of the samples stored in the registers 722-0 and 722-3, i.e., X(0)+X(−3). The adder 726-1 outputs the sum of the samples stored in the registers 722-1 and 722-2, i.e., X(−1)+X(−2).

On the $(\lceil L/2 \rceil+1)^{th}$ cycle, the selectors 735-u output the $(\lceil L/2 \rceil+1)^{th}$ tap coefficient values stored therein. For instance, on the third cycle, the selector 735-0 outputs the coefficient $h_1+h_2$, the selector 735-1 outputs the coefficient $h_5+h_6$ and the selector 735-2 outputs 0. The multiplier 740-0 thus multiplies the coefficient $h_1+h_2$ with the sum X(0)+X(−3), the multiplier 740-1 multiplies the coefficient $h_5+h_6$ with the sum X(−1)+X(−2), and the multiplier multiplies the coefficient 0 with 0. These products are outputted as the bank filter terms $yx_0$, $yx_1$, and $yx_2$, respectively, to the binary adder tree 790 and are accumulated for determining $y'_j(t)$.

On each of the next cycles through cycle L, the multiplexers 724-0, 724-1 and 724-2 select the same samples and the adders 726-0 and 726-1 output the same sums of samples. The selectors 735-0, 735-1 and 735-2 output the tap coefficient value corresponding to that cycle. That is, on the fourth cycle, the selector 735-0 outputs $h_0+h_3$, the selector 735-1 outputs $h_4+h_7$, and the selector 735-2 outputs 0. The multipliers 740-0, and 740-1 multiply the corresponding sums of samples outputted from the adders 724-0 or 724-1 to produce the respective modified bank filter terms $yx_0$, $yx_1$. (The multiplier 740-2 multiplies the coefficient 0 with the value 0 outputted from the multiplexer 724-2 to produce the merged bank filter term $yx_2=0$.) These merged bank filter terms $yx_0$, $yx_1$, and $yx_2$ are accumulated by the binary adder tree 790 for determining $y'_j(t)$. Finally, after accumulating all J of the merged bank filter output values $y'_j(t)$, the accumulator 750 outputs g(t).

The above process then repeats i e the next sample $X(\lfloor t-1/L \rfloor-i+1)$ (namely, X(1)) is shifted into the shift register 722 of the pre-processing stage 710 and the signal ct2 is set to 1, etc. Initially, the shift register 722 may be largely empty. Thus, the initially determined values of g(t) may not be useful. Alternatively, the shift register 722 may be pre-loaded with approximated sample data so that all of the determined values of g(t) are useful.

Figure 5:
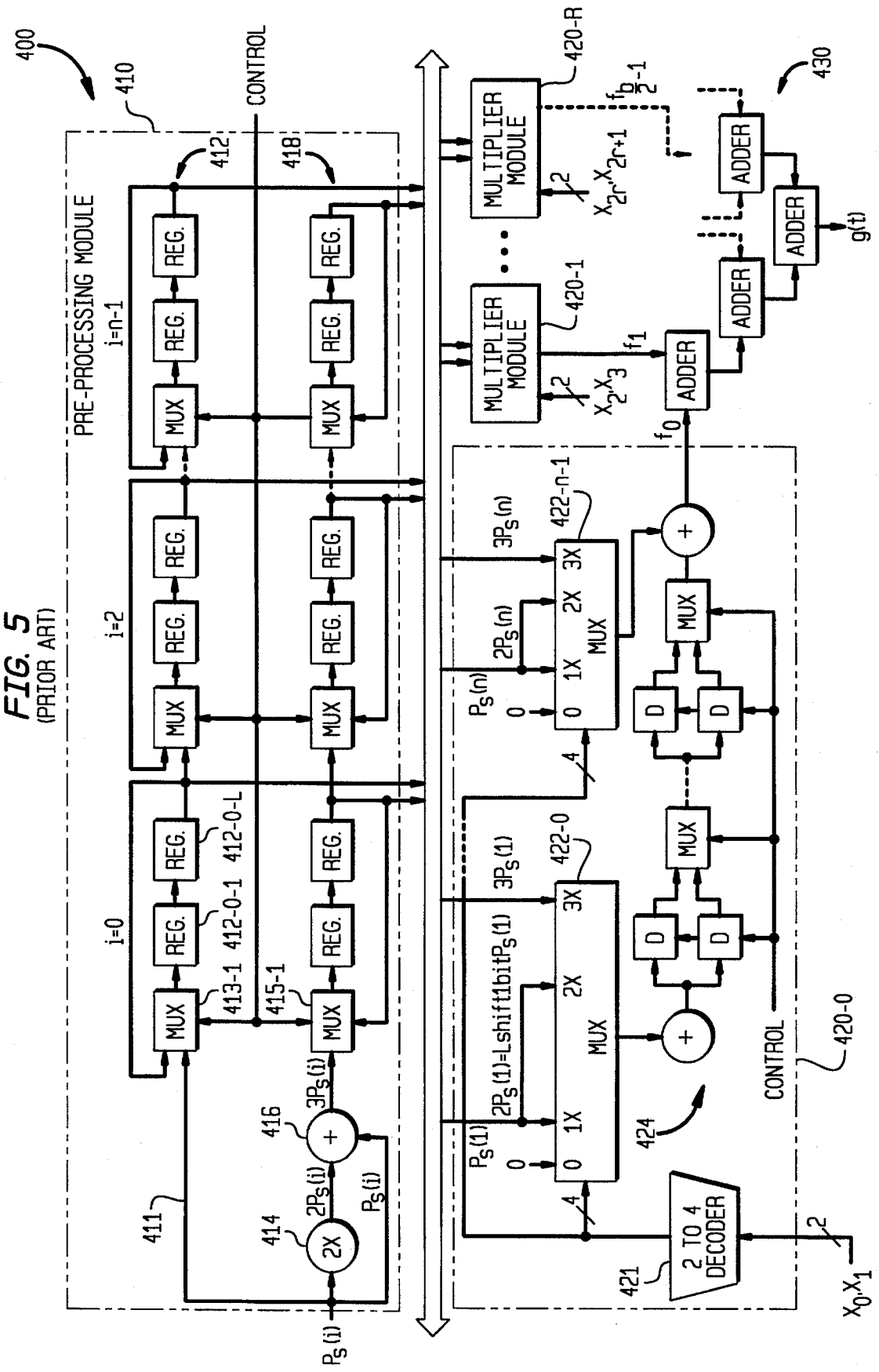
FIG. 5 shows a fourth conventional FIR filter interpolator.

The interpolator 700 has dramatically lower processing requirements that the FIR filter 400 (FIG. 5). The binary adder tree 790 of the interpolator 700 requires n/2 adders for pre-processing the inputted samples X and less than (approximately) n/2 adders in the binary adder tree 790. The multiplication stage 730 requires n/2+1 multipliers or if equivalent Booth multipliers are used (n/2+1)·b/2 adders. Thus, the interpolator according to the present invention can be implemented with approximately ((n/2+1)·b/2+n) adders. In contrast, the binary adder tree 430 of the FIR filter 400 requires approximately (n+1)·b/2 adders. Thus, the conventional FIR filter 400 requires:

$$(n+1) \cdot \frac{b}{2} - \left( \left( \frac{n}{2}+1 \right) \cdot \frac{b}{2} + n \right) = \frac{n}{2} \cdot \left( \frac{b}{2} - 2 \right)$$

more adders. Generally, each video sample has more than 4 bits, i.e., b>4. Thus, there is a savings in using the interpolator 700.

In short, an interpolator is disclosed with merged filter banks formed by combining cross-symmetric bank filter terms. The merger of filter banks in this fashion reduces processing requirements (i.e., number of circuits, area occupied by the circuits, and processing time) without impeding the accuracy or performance of the interpolator.

Finally, the above discussion is intended to be merely illustrative of the invention. Those having ordinary skill in the art may devise numerous alternative embodiments without departing from the spirit or scope of the following claims.

I claim:

1. A digital poly-phase FIR filter for producing an L phase interpolation of a input sample $$X\left( \left\lfloor \frac{t-1}{L} \right\rfloor - i \right)$$

based on L filter banks and n tap coefficients $P_l(i)$ in each $l^{th}$ one of said filter banks where $1 \leq l \leq L$ and where $0 \leq i \leq (n-1)$, said digital filter comprising:

a first circuit for producing, for each time t, bank filter terms of a merged filter bank having an output value which changes between a previous time t−1 and said time t, said produced bank filter terms including at least one combination of two cross-symmetric bank filter terms, said cross-symmetric bank filter terms being:

for an in phase condition:

$$P_k(i) \cdot X\left( \left\lfloor \frac{t-k}{L} \right\rfloor - i \right) + P_{L-k+1}(i) \cdot X\left( \left\lfloor \frac{t-(L-k+1)}{L} \right\rfloor - i \right)$$

and $$P_k(n-1-i) \cdot X\left( \left\lfloor \frac{t-k}{L} \right\rfloor - (n-1-i) \right) + P_{L-k+1}(n-1-i) \cdot X\left( \left\lfloor \frac{t-(L-k+1)}{L} \right\rfloor - (n-1-i) \right)$$

for an out of phase condition:

$$P_k(i) \cdot X\left( \left\lfloor \frac{t-k}{L} \right\rfloor - i \right) + P_{L-k+1}(i-1) \cdot X\left( \left\lfloor \frac{t-(L-k+1)}{L} \right\rfloor - (i-1) \right)$$

and $$P_k(n-i) \cdot X\left( \left\lfloor \frac{t-k}{L} \right\rfloor - (n-i) \right) + P_{L-k+1}(n-1-i) \cdot X\left( \left\lfloor \frac{t-(L-k+1)}{L} \right\rfloor - (n-1-i) \right)$$

wherein $1 \leq k \leq L$, and t=w·L+k for any non-negative integer w of said L filter banks on which said digital filter is based, and a second circuit for adding together, for each time t, said bank filter terms produced in said first circuit to produce said merged filter bank output value which changes between said previous time t−1 and said time t.

2. The digital filter of claim 1 further comprising:

a third circuit for adding together, for each time t, said merged filter bank output value, which changes between said previous time t−1 and said current time t and at least one other merged filter bank value, produced by said first circuit at a time other than said current time t, to produce said interpolated value.

3. The digital filter of claim 2 wherein for each time t, said third circuit adds together $\lceil L/2 \rceil$ merged bank filter output values to produce an interpolated value g(t) of said inputted sample $$X\left(\left\lfloor \frac{t-1}{L} \right\rfloor - i\right).$$

4. The digital filter of claim 1 wherein for each time t, said first circuit produces at most $\lceil n/2 \rceil$ bank filter terms of said merged filter bank that has an output value which changes between said previous time t−1 and said current time t.

5. The digital filter of claim 1 wherein for a particular time t, such that $L/2+1 \leq k \leq L$ said changed merged filter bank output is given by:

$$y'_j(t) = \sum_{i=0}^{U-1} (P_k(i) + P_{L-k+1}(i)) \cdot \left[ X\left(\left\lfloor \frac{t-k}{L} \right\rfloor - i\right) + X\left(\left\lfloor \frac{t-k}{L} \right\rfloor - (n-i-1)\right) \right]$$

wherein n and L are even and $1 \leq j \leq \lceil L/2 \rceil$.

6. The digital filter of claim 1 wherein for a particular time t, such that $1 \leq k \leq L/2$, said output of said merged filter bank that changes between said previous time t−1 and said current time t is given by:

$$y'_j(t) = P_k(0) \cdot \left[ X\left(\left\lfloor \frac{t+k-1}{L} \right\rfloor - n\right) + X\left(\left\lfloor \frac{t-k}{L} \right\rfloor\right) \right] +$$

$$\sum_{i=1}^{U-2} (P_k(i) + P_{L-k+1}(i-1)) \cdot \left[ X\left(\left\lfloor \frac{t-k}{L} \right\rfloor - i\right) + X\left(\left\lfloor \frac{t-k}{L} \right\rfloor - (n-i)\right) \right] +$$

$$2 \cdot P_k(U-1) \cdot X\left(\left\lfloor \frac{t-k}{L} \right\rfloor - U + 1\right)$$

wherein n and L are even and $1 \leq j \leq \lceil L/2 \rceil$.

7. A poly-phase interpolator with merged filter banks formed by combining cross-symmetric bank filter terms of said interpolator, comprising:

a first circuit for receiving an inputted sequence of samples $$X\left(\left\lfloor \frac{t-1}{L} \right\rfloor - i\right) \text{ to } X\left(\left\lfloor \frac{t-1}{L} \right\rfloor - i - n\right),$$

where L is a number of phases of said interpolator, n is a number of tap coefficients in each filter bank of said interpolator prior to merger and $0 \leq i \leq (n-1)$, and for outputting a sequence of sample values including a combination of samples for cross-symmetric bank filter terms, said cross-symmetric bank filter terms being:

for an in phase condition:

$$P_k(i) \cdot X\left(\left\lfloor \frac{t-k}{L} \right\rfloor - i\right) +$$

$$P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right) +$$

$$P_{L-k+1}(n-1-i) \cdot X\left(\left\lfloor \frac{t-(L-k+1)}{L} \right\rfloor - (n-1-i)\right)$$

for an out of phase condition:

$$P_k(i) \cdot X\left(\left\lfloor \frac{t-k}{L} \right\rfloor - i\right) +$$

$$P_{L-k+1}(i-1) \cdot X\left(\left\lfloor \frac{t-(L-k+1)}{L} \right\rfloor - (i-1)\right)$$

and $$P_k(n-i) \cdot X\left(\left\lfloor \frac{t-k}{L} \right\rfloor - (n-i)\right) +$$

$$P_{L-k+1}(n-1-i) \cdot X\left(\left\lfloor \frac{t-(L-k+1)}{L} \right\rfloor - (n-1-i)\right)$$

wherein $1 \leq k \leq L$, and $t = w \cdot L + k$ for any non-negative integer w of said L filter banks on which said digital filter is based, a second circuit for outputting a sequence of tap coefficient values including a combination of tap coefficients for said cross-symmetric bank filter terms, and a third circuit for receiving said sequence of sample values and said sequence of tap coefficient values, for producing a product of each sample value of said sequence of sample values with a corresponding tap coefficient value of said sequence of tap coefficient values, and for producing an interpolated value from said products.

8. The interpolator of claim 7 wherein said third circuit determines, from said products, an output value of at least one merged filter bank that changes between a previous time t−1 and a current time t, and adds said determined output value to at least one output value of another merged filter bank that does not change between said previous time t−1 and said current time t, said sum forming said interpolated value.

9. The interpolator of claim 8 wherein said third circuit comprises:

an accumulator for adding together said products to produce said output value of said merged filter bank that changes between said previous time t−1 and said current time t, and for adding together said output value of said merged filter bank that changes between said previous time t−1 and said current time t and at least one other merged filter bank value, produced by said third circuit at a time other than said current time t, and a latch for storing said output value of said merged filter bank produced in said accumulator when said output value of said merged filter bank, that changes between said previous time t−1 and said current time t, is unchanged between said current time t and a subsequent time t+1.

10. The interpolator of claim 8 wherein for each time t, said third circuit performs at most $\lceil L/2 \rceil - 1$ additions of merged filter bank output values to produce said interpolated value.

11. The interpolator of claim 7, wherein said first circuit comprises:

a RAM for storing said samples $$X\left(\left\lfloor \frac{t-1}{L} \right\rfloor - i\right) \text{ to } X\left(\left\lfloor \frac{t-1}{L} \right\rfloor - i - n\right),$$

and an adder for adding together successive samples outputted from said RAM to produce said combination of samples.

12. The interpolator of claim 11 wherein said first circuit further comprises:

a plurality of counters for addressing said RAM, and for causing said RAM to successively output pairs of samples corresponding to cross-symmetric bank filter terms.

13. The interpolator of claim 7 wherein said second circuit comprises:

a ROM for storing said tap coefficients and said combination of tap coefficients, and a ROM counter for addressing said ROM during each time t so that said ROM outputs said sequence of tap coefficient values of a merged filter bank which has an output value that changes between a previous time $t-1$ and said time t.

14. The interpolator of claim 7 wherein for each time t, said first circuit performs, at most, $\lceil n/2 \rceil$ additions and wherein said third circuit performs, at most, $\lceil n/2 \rceil - 1$ additions and $\lceil n/2 \rceil + 1$ multiplications to produce each merged filter bank output value, which changes between said previous time $t-1$ and said current time t.

15. A poly-phased interpolator with merged filter banks formed by combining cross-symmetric bank filter terms of said interpolator, comprising:

a module core for receiving an inputted sequence of samples $$X\left(\left\lfloor \frac{t-1}{L} \right\rfloor - i\right) \text{ to } X\left(\left\lfloor \frac{t-1}{L} \right\rfloor - i - n\right),$$

where L is a number of phases of said interpolator, n is a number of tap coefficients in each filter bank of said interpolator prior to merger and $0 \leq i \leq n-1$, and at least one corresponding sequence of tap coefficient values including a combination of tap coefficients for cross-symmetric bank filter terms, said cross-symmetric bank filter terms being: for an in phase condition:

$$P_k(i) \cdot X\left(\left\lfloor \frac{t-k}{L} \right\rfloor - i\right) +$$

$$P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right) +$$

$$P_{L-k+1}(n-1-i) \cdot X\left(\left\lfloor \frac{t-(L-k+1)}{L} \right\rfloor - (n-1-i)\right)$$

for an out of phase condition:

$$P_k(i) \cdot X\left(\left\lfloor \frac{t-k}{L} \right\rfloor - i\right) +$$

$$P_{L-k+1}(i-1) \cdot X\left(\left\lfloor \frac{t-(L-k+1)}{L} \right\rfloor - (i-1)\right)$$

and $$P_k(n-i) \cdot X\left(\left\lfloor \frac{t-k}{L} \right\rfloor - (n-i)\right) +$$

$$P_{L-k+1}(n-1-i) \cdot X\left(\left\lfloor \frac{t-(L-k+1)}{L} \right\rfloor - (n-1-i)\right)$$

wherein $1 \leq k \leq L$, and
$t = w \cdot L + k$ for any non-negative integer w of said L filter banks on which said digital filter is based, said module core also for outputting, in parallel, a plurality of bank filter terms of said merged filter banks formed by selectively multiplying each of said samples with a corresponding tap coefficient value, and an adder tree circuit for producing a merged filter bank output value from said bank filter terms outputted from said module core.

16. The interpolator of claim 15 further comprising:

a circuit for storing said merged filter bank output values produced by said adder circuit and adding together said bank filter terms to produce an interpolated sample.

17. The interpolator of claim 15 wherein said module core comprises a pre-processing stage for producing a plurality of sample values from said inputted samples including at least one combination of said samples corresponding to said combination of tap coefficients.

18. The interpolator of claim 17 wherein said pre-processing stage comprises:

a shift register for storing said inputted samples $$X\left(\left\lfloor \frac{t-1}{L} \right\rfloor - i\right) \text{ to } X\left(\left\lfloor \frac{t-1}{L} \right\rfloor - i - n\right),$$

a plurality of multiplexers including at least one multiplexer receiving as inputs two of said samples stored in said shift register, and a plurality of adder circuits, including at least one adder circuit receiving as inputs one of said samples stored in said shift register and a sample outputted from one of said at least one multiplexers.

19. The interpolator of claim 17 wherein said module core further comprises:

a plurality of selector circuits for storing said tap coefficient values and for cyclically outputting particular ones of said tap coefficient values stored therein in parallel, and a plurality of multipliers which operate in parallel, each of which sequentially multiplies one of said sample values outputted from said preprocessing stage with a corresponding one of said tap coefficient values outputted from said selector circuits.

20. The interpolator of claim 15 wherein said module core comprises n/2 adder circuits for adding said samples together and n/2+1 multiplier circuits for producing merged filter bank terms and wherein said adder tree circuit comprises approximately n/2 adder circuits.

21. The interpolator of claim 20 wherein said multiplier circuits are Booth's algorithm multiplier circuits which each comprises b/2 adder circuits, and wherein said interpolator circuit comprises approximately $((n/2+1) \cdot b/2 + n)$ adder circuits.

22. A method for generating a poly-phase interpolation of an input sequence of samples, said sequence comprising L phases and said poly-phase interpolation modelling an L filter bank interpolation, including one $k^{th}$ filter bank for each of said L phases, $1 \leq k \leq L$ and n tap coefficients per filter bank labeled $0 \leq i \leq n$, said method comprising the steps of:

merging filter banks of an interpolator by combining cross-symmetric bank filter terms of said filter banks, said cross-symmetric bank filter terms being:

for an in phase condition:

$$P_k(i) \cdot X\left(\left\lfloor \frac{t-k}{L} \right\rfloor - i\right) +$$

$$P_{L-k+1}(i) \cdot X\left(\left\lfloor \frac{t-(L-k+1)}{L} \right\rfloor - i\right)$$

and $$P_k(n-1-i) \cdot X\left(\left\lfloor \frac{t-k}{L} \right\rfloor - (n-1-i)\right) +$$

$$P_{L-k+1}(n-1-i) \cdot X\left(\left\lfloor \frac{t-(L-k+1)}{L} \right\rfloor - (n-1-i)\right)$$

for an out of phase condition:

$$P_k(i) \cdot X\left(\left\lfloor \frac{t-k}{L} \right\rfloor - i\right) +$$

$$P_{L-k+1}(i-1) \cdot X\left(\left\lfloor \frac{t-(L-k+1)}{L} \right\rfloor - (i-1)\right)$$

and $$P_k(n-i) \cdot X\left(\left\lfloor \frac{t-k}{L} \right\rfloor - (n-i)\right) +$$

$$P_{L-k+1}(n-1-i) \cdot X\left(\left\lfloor \frac{t-(L-k+1)}{L} \right\rfloor - (n-1-i)\right)$$

wherein $1 \leq k \leq L$, and $t = w \cdot L + k$ for any non-negative integer w of said L filter banks on which said digital filter is based, inputting combinations of samples of said input sequence of samples corresponding to said merged filter banks, multiplying said combinations of input samples with combinations of tap coefficients of said merged filter banks, and adding together said products to produce at least one merged filter bank output value.

23. The method of claim 22 further comprising the step of adding together said merged filter bank values to produce an interpolated sample.

* * * * *